US009882014B2

(12) United States Patent
Nakazawa et al.

(10) Patent No.: US 9,882,014 B2
(45) Date of Patent: Jan. 30, 2018

(54) SEMICONDUCTOR DEVICE AND METHOD FOR MANUFACTURING THE SAME

(71) Applicant: SEMICONDUCTOR ENERGY LABORATORY CO., LTD., Atsugi-shi, Kanagawa-ken (JP)

(72) Inventors: Yasutaka Nakazawa, Tochigi (JP); Takayuki Cho, Tochigi (JP); Shunsuke Koshioka, Tochigi (JP); Takahiro Sato, Tochigi (JP); Naoya Sakamoto, Tochigi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/549,916

(22) Filed: Nov. 21, 2014

(65) Prior Publication Data
US 2015/0155362 A1 Jun. 4, 2015

(30) Foreign Application Priority Data
Nov. 29, 2013 (JP) .................................. 2013-247192

(51) Int. Cl.
*H01L 29/786* (2006.01)
*H01L 29/12* (2006.01)
*H01L 29/45* (2006.01)

(52) U.S. Cl.
CPC .......... *H01L 29/45* (2013.01); *H01L 29/7869* (2013.01); *H01L 29/78648* (2013.01); *H01L 29/78696* (2013.01)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Seahvosh Nikmanesh
*Assistant Examiner* — Xiaoming Liu
(74) *Attorney, Agent, or Firm* — Fish & Richardson P.C.

(57) ABSTRACT

The semiconductor device includes an oxide semiconductor; a source electrode and a drain electrode in contact with the oxide semiconductor; a gate insulating film over the oxide semiconductor, the source electrode, and the drain electrode; and a gate electrode overlapping the oxide semiconductor, part of the source electrode, and part of the drain electrode with the gate insulating film positioned therebetween. The source electrode and the drain electrode each include a Cu—X alloy film (X is Mn, Ni, Cr, Fe, Co, Mo, Ta, or Ti), and the thickness of a region of the oxide semiconductor over which neither the source electrode nor the drain electrode is provided is smaller than the thicknesses of regions of the oxide semiconductor over which the source electrode and the drain electrode are provided.

33 Claims, 28 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,927,971 B2 | 4/2011 | Tamura et al. | |
| 7,932,521 B2 | 4/2011 | Akimoto et al. | |
| 8,207,756 B2 | 6/2012 | Shionoiri et al. | |
| 8,274,077 B2 | 9/2012 | Akimoto et al. | |
| 8,344,374 B2 | 1/2013 | Yamazaki et al. | |
| 8,466,463 B2 | 6/2013 | Akimoto et al. | |
| 8,471,256 B2 | 6/2013 | Yamazaki et al. | |
| 8,502,216 B2 | 8/2013 | Akimoto et al. | |
| 8,530,335 B2 | 9/2013 | Tamura et al. | |
| 8,530,892 B2 | 9/2013 | Yamazaki et al. | |
| 8,570,070 B2 | 10/2013 | Shionoiri et al. | |
| 8,629,069 B2 | 1/2014 | Akimoto et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,816,349 B2 | 8/2014 | Yamazaki et al. | |
| 8,866,140 B2 | 10/2014 | Koike et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308805 A1 | 12/2008 | Akimoto et al. | |
| 2009/0045399 A1* | 2/2009 | Kaji | H01L 29/7869 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0104851 A1 | 5/2011 | Akimoto et al. | |
| 2011/0121290 A1 | 5/2011 | Akimoto et al. | |
| 2012/0104385 A1* | 5/2012 | Godo | H01L 29/7869 257/43 |
| 2012/0112184 A1* | 5/2012 | Yamazaki | H01L 27/124 257/43 |
| 2012/0132903 A1* | 5/2012 | Yamazaki | H01L 21/0242 257/43 |
| 2012/0319102 A1* | 12/2012 | Yamazaki | H01L 29/7869 257/43 |
| 2013/0113044 A1 | 5/2013 | Yamazaki et al. | |
| 2013/0147518 A1 | 6/2013 | Shionoiri et al. | |
| 2013/0168671 A1 | 7/2013 | Koike et al. | |
| 2013/0248854 A1 | 9/2013 | Yamazaki et al. | |
| 2013/0299824 A1 | 11/2013 | Akimoto et al. | |
| 2013/0323912 A1 | 12/2013 | Tamura et al. | |
| 2014/0087517 A1 | 3/2014 | Akimoto et al. | |
| 2014/0306217 A1 | 10/2014 | Yamazaki et al. | |
| 2014/0339538 A1 | 11/2014 | Yamazaki et al. | |
| 2014/0339539 A1 | 11/2014 | Yamazaki et al. | |
| 2014/0339544 A1 | 11/2014 | Hanaoka et al. | |
| 2014/0339548 A1 | 11/2014 | Yamazaki et al. | |
| 2014/0340608 A1 | 11/2014 | Yamazaki et al. | |
| 2014/0361289 A1 | 12/2014 | Suzawa | |
| 2014/0361290 A1 | 12/2014 | Yamazaki et al. | |
| 2014/0361292 A1 | 12/2014 | Yamazaki et al. | |
| 2014/0361293 A1 | 12/2014 | Yamazaki et al. | |
| 2014/0362324 A1 | 12/2014 | Yamazaki et al. | |
| 2014/0374744 A1 | 12/2014 | Matsukura | |
| 2015/0014679 A1 | 1/2015 | Sasagawa et al. | |
| 2015/0014680 A1 | 1/2015 | Yamazaki et al. | |
| 2015/0021596 A1 | 1/2015 | Yamazaki et al. | |
| 2015/0028330 A1 | 1/2015 | Yamazaki et al. | |
| 2015/0034949 A1 | 2/2015 | Yamazaki | |
| 2015/0069384 A1 | 3/2015 | Kobayashi et al. | |
| 2015/0077162 A1 | 3/2015 | Yamazaki et al. | |
| 2015/0084044 A1 | 3/2015 | Tanaka et al. | |
| 2015/0102342 A1 | 4/2015 | Yamazaki | |

(56) References Cited

U.S. PATENT DOCUMENTS

| | | |
|---|---|---|
| 2015/0153599 A1 | 6/2015 | Yamazaki et al. |
| 2015/0155505 A1 | 6/2015 | Yamazaki et al. |
| 2015/0171115 A1 | 6/2015 | Yamazaki et al. |
| 2015/0171116 A1 | 6/2015 | Okazaki et al. |
| 2015/0171222 A1 | 6/2015 | Sasagawa et al. |
| 2015/0179747 A1 | 6/2015 | Ito et al. |
| 2015/0179803 A1 | 6/2015 | Yamazaki et al. |
| 2015/0187855 A1 | 7/2015 | Yamazaki et al. |
| 2015/0187951 A1 | 7/2015 | Endo et al. |
| 2015/0187952 A1 | 7/2015 | Yamazaki et al. |
| 2015/0200305 A1 | 7/2015 | Kobayashi et al. |
| 2015/0214378 A1 | 7/2015 | Matsubayashi et al. |
| 2015/0214381 A1 | 7/2015 | Sasagawa et al. |
| 2015/0228799 A1 | 8/2015 | Koezuka et al. |
| 2015/0255310 A1 | 9/2015 | Yamazaki et al. |
| 2015/0311346 A1 | 10/2015 | Koezuka et al. |
| 2015/0325600 A1 | 11/2015 | Sakata et al. |
| 2015/0325708 A1 | 11/2015 | Yakubo et al. |
| 2015/0340505 A1 | 11/2015 | Yamazaki et al. |
| 2015/0348998 A1 | 12/2015 | Koezuka et al. |
| 2015/0349131 A1 | 12/2015 | Atsumi et al. |
| 2015/0364610 A1 | 12/2015 | Tsubuku et al. |
| 2015/0372122 A1 | 12/2015 | Hodo et al. |
| 2015/0372146 A1 | 12/2015 | Shishido et al. |
| 2016/0013321 A1 | 1/2016 | Kobayashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 A | 5/2007 |
| WO | WO-2004/114391 | 12/2004 |
| WO | 2012-002573 A1 | 1/2012 |
| WO | 2012-002574 A1 | 1/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronics Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Papers:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technolgy", SID Digest '04 : SID International Symposium Digest of Technical Papers, 2004, vol. 35, pp. 860-863.

Janotti.A et al., "Native Point Defecs in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-inch WXGA AMOLED Display Driven by Indium-Gallium-Zinc Oxid TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

(56) References Cited

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-015501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline in InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 13A
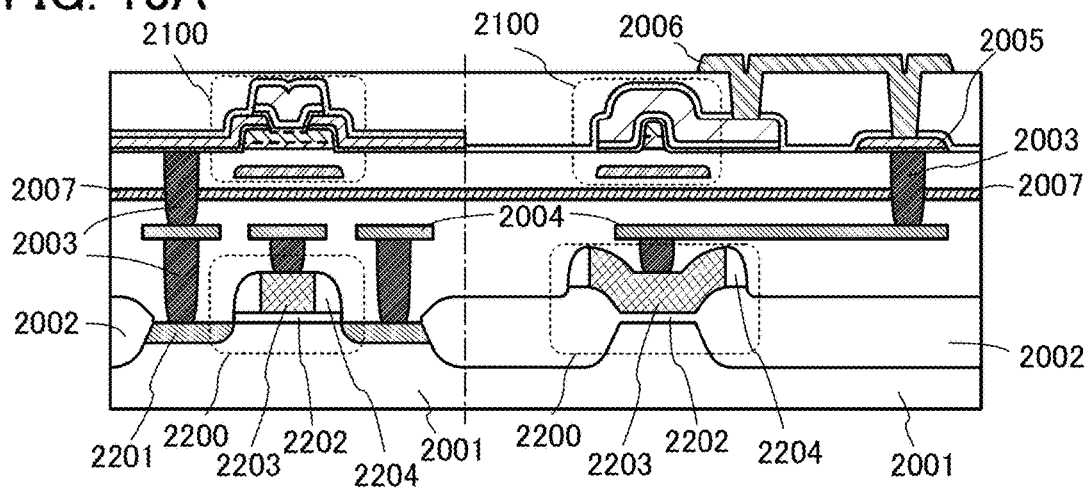
FIG. 13B
FIG. 13C
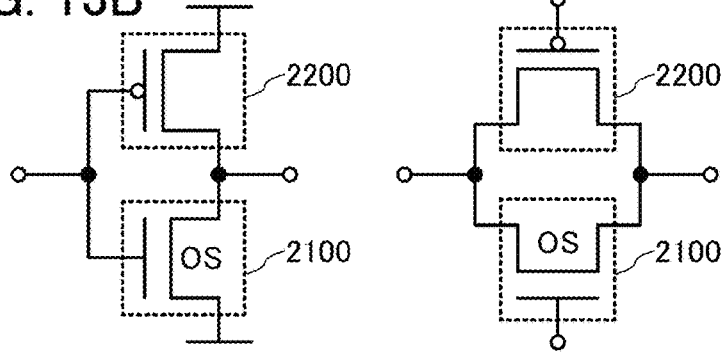
FIG. 13D
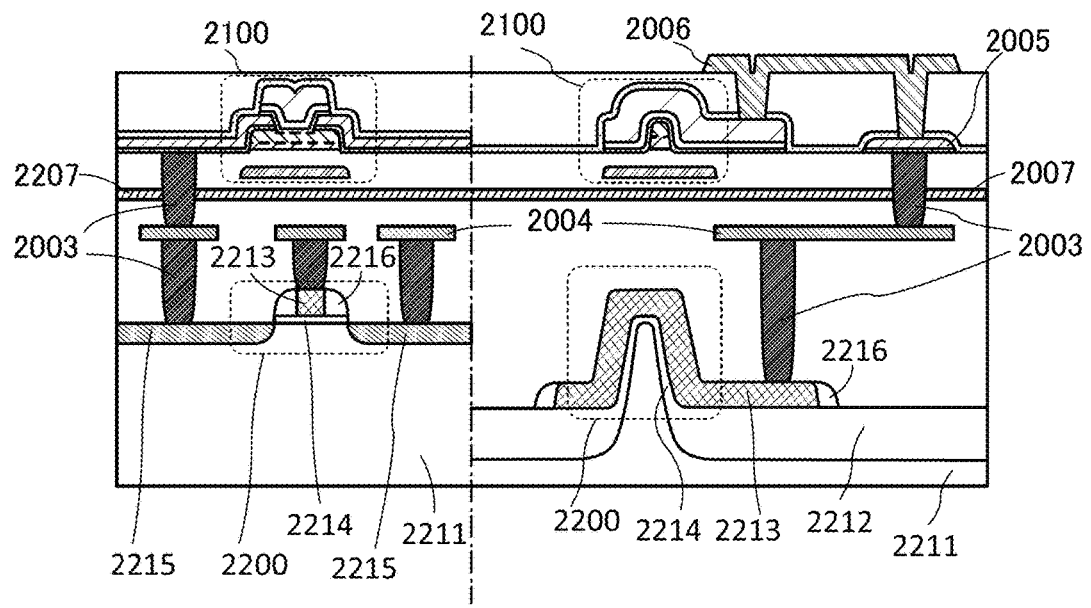

FIG. 25A
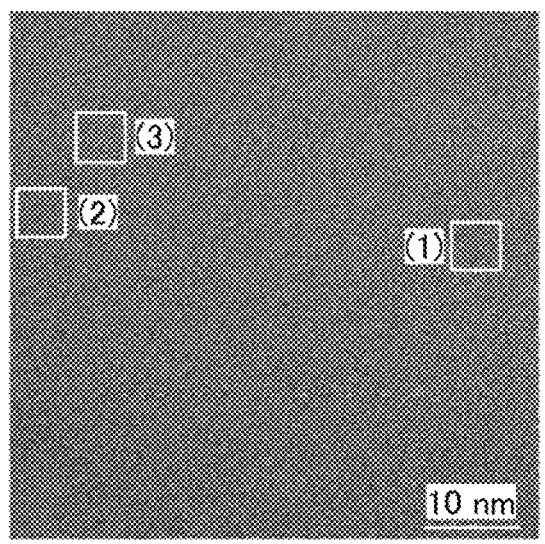
FIG. 25B  FIG. 25C  FIG. 25D
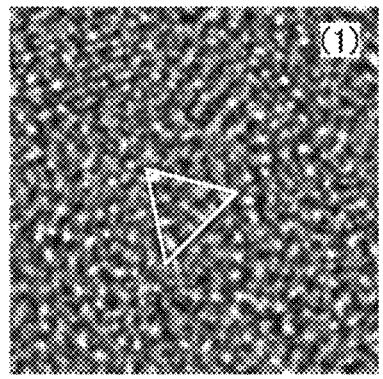 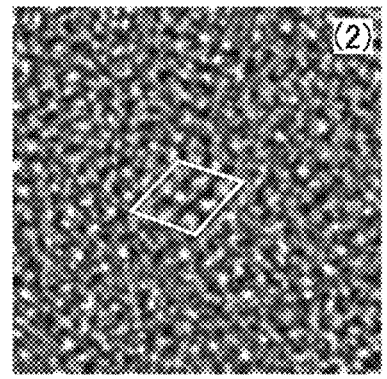 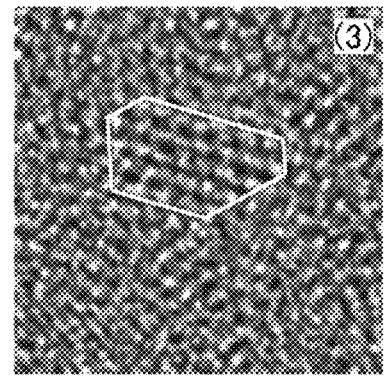

FIG. 27A
FIG. 27B
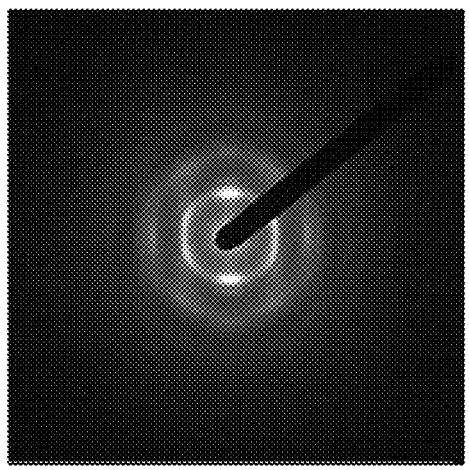
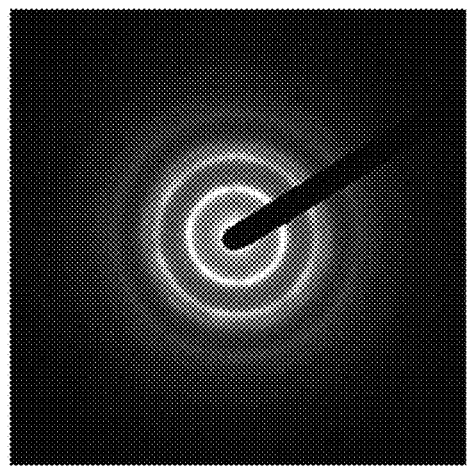

SEMICONDUCTOR DEVICE AND METHOD FOR MANUFACTURING THE SAME

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

In recent years, improvement in operation speed is required in semiconductor devices (e.g., a central processing unit (CPU) and a dynamic random access memory (DRAM)) including transistors. The resistance of a wiring connected to a transistor can be a factor that inhibits an improvement in operation speed; therefore, a reduction in wiring resistance is required.

Research and development of using copper (Cu) as a material of a wiring is extensively conducted. However, Cu is disadvantageous in that adhesion thereof to an insulating film is low and that the characteristics of a transistor easily deteriorate due to diffusion of Cu into a semiconductor region of the transistor. Note that a silicon-based semiconductor is widely known as a semiconductor applicable to a transistor, and as another material, an oxide semiconductor has attracted attention (see Patent Document 1).

Furthermore, a Cu—Mn alloy is disclosed as an ohmic electrode formed over a semiconductor including an oxide semiconductor containing indium (see Patent Document 2).

REFERENCE

Patent Documents

[Patent Document 1] Japanese Published Patent Application No. 2007-123861
[Patent Document 2] PCT International Publication No. 2012/002573

SUMMARY OF THE INVENTION

According to a structure disclosed in Patent Document 2, a Cu—Mn alloy film is deposited over an oxide semiconductor, and then heat treatment is performed on the Cu—Mn alloy film to form an Mn oxide at the joint interface between the oxide semiconductor and the Cu—Mn alloy film. The Mn oxide is formed in such a manner that Mn in the Cu—Mn alloy film diffuses toward the oxide semiconductor and is preferentially bonded to oxygen included in the oxide semiconductor. A region of the oxide semiconductor which is reduced by Mn becomes oxygen vacancy, so that the region has a high carrier density and thus has high conductivity. Furthermore, Mn diffuses toward the oxide semiconductor and thus the Cu—Mn alloy becomes pure Cu, whereby an ohmic electrode with a low electric resistance can be obtained.

However, in the above structure, an influence of Cu that diffuses from the ohmic electrode after the ohmic electrode is formed is not considered. For example, after an electrode including a Cu—Mn alloy film is formed over an oxide semiconductor, heat treatment is performed, whereby an Mn oxide is formed at the joint interface between the oxide semiconductor and the Cu—Mn alloy film. Because of formation of the Mn oxide, even if the amount of Cu which can diffuse into the oxide semiconductor from the Cu—Mn alloy film in contact with the oxide semiconductor can be reduced, Cu which diffuses from a side surface of the Cu—Mn alloy film or a side surface or a surface of a pure Cu film obtained by release of Mn from the Cu—Mn alloy film is attached to the surface of the oxide semiconductor.

In the case where a transistor including an oxide semiconductor is used, part of a surface of the oxide semiconductor serves as a channel, and there is a problem in that the transistor characteristics obtained in a gate BT stress test, which is one kind of reliability test of a transistor, deteriorate when Cu is attached to the channel side.

In view of the above problem, an object of one embodiment of the present invention is to provide a novel semiconductor device in which a transistor using an oxide semiconductor film includes a wiring, a signal line, or the like formed using a metal film containing Cu. Another object of one embodiment of the present invention is to provide a method for manufacturing a semiconductor device in which a transistor using an oxide semiconductor includes a wiring, a signal line, or the like formed using a metal film containing Cu. Another object of one embodiment of the present invention is to provide a novel semiconductor device in which a transistor using an oxide semiconductor includes a metal film that contains Cu and has a favorable shape. Another object of one embodiment of the present invention is to provide a novel semiconductor device and a method for manufacturing the novel semiconductor device.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention is a semiconductor device including an oxide semiconductor; a source electrode and a drain electrode in contact with the oxide semiconductor; a gate insulating film over the oxide semiconductor, the source electrode, and the drain electrode; and a gate electrode overlapping the oxide semiconductor, part of the source electrode, and part of the drain electrode with the gate insulating film positioned therebetween. In the semiconductor device, the source electrode and the drain electrode each include a Cu—X alloy film (X is Mn, Ni, Cr, Fe, Co, Mo, Ta, or Ti), and the thickness of a region of the oxide semiconductor over which neither the source electrode nor the drain electrode is provided is smaller than the thicknesses of regions of the oxide semiconductor over which the source electrode and the drain electrode are provided.

In the above embodiment, the source electrode and the drain electrode each include a first Cu—Mn alloy film and a Cu film over the first Cu—Mn alloy film.

In the above embodiments, the source electrode and the drain electrode each include a second Cu—Mn alloy film over the Cu film.

In the above embodiment, the bottom surfaces, the top surfaces, or the side surfaces of the source electrode and the drain electrode may include manganese oxide.

One embodiment of the present invention is a semiconductor device including an oxide semiconductor; a source electrode and a drain electrode in contact with the oxide semiconductor; a gate insulating film over the oxide semiconductor, the source electrode, and the drain electrode; and a gate electrode overlapping the oxide semiconductor, part of the source electrode, and part of the drain electrode with the gate insulating film positioned therebetween. In the semiconductor device, the gate electrode includes a Cu—X alloy film (X is Mn, Ni, Cr, Fe, Co, Mo, Ta, or Ti).

In the above embodiment, the gate electrode includes a first Cu—Mn alloy film and a Cu film over the first Cu—Mn alloy film.

In the above embodiment, the gate electrode includes a second Cu—Mn alloy film over the Cu film.

In the above embodiment, the bottom surface, the top surface, or the side surface of the gate electrode may include manganese oxide.

One embodiment of the present invention is a semiconductor device including a conductive film formed over an insulating surface; an insulating film over the conductive film; an oxide semiconductor overlapping the conductive film with the insulating film positioned therebetween; a source electrode and a drain electrode in contact with the oxide semiconductor; a gate insulating film over the oxide semiconductor, the source electrode, and the drain electrode; and a gate electrode overlapping the oxide semiconductor, part of the source electrode, and part of the drain electrode with the gate insulating film positioned therebetween. In the semiconductor device the conductive film includes a Cu—X alloy film (X is Mn, Ni, Cr, Fe, Co, Mo, Ta, or Ti).

In the above embodiment, the conductive film includes a first Cu—Mn alloy film and a Cu film over the first Cu—Mn alloy film.

In the above embodiment, the conductive film includes a second Cu—Mn alloy film over the Cu film.

In the above embodiment, the bottom surface, the top surface, or the side surface of the conductive film may include manganese oxide.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. Examples of an attachment film are attachment films formed using polypropylene, polyester, polyvinyl fluoride, polyvinyl chloride, and the like. Examples of a base film are base films formed using polyester, polyamide, polyimide, aramid, epoxy, an inorganic vapor a deposition film, and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Note that a transistor may be formed using one substrate, and then the transistor may be transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability, high heat resistance can be provided, or reduction in weight or thickness can be achieved.

According to one embodiment of the present invention, a novel semiconductor device in which a transistor using an oxide semiconductor includes a wiring, a signal line, or the like formed using a metal film containing copper can be provided. According to another embodiment of the present invention, a method for manufacturing a semiconductor device in which a transistor using an oxide semiconductor includes a wiring, a signal line, or the like formed using a metal film containing copper can be provided. According to another embodiment of the present invention, a novel semiconductor device in which a transistor using an oxide semiconductor includes a metal film that contains copper and has a favorable shape can be provided. According to another embodiment of the present invention, a novel semiconductor device of which productivity is improved can be provided. According to another embodiment of the present invention, a novel semiconductor device and a method for manufacturing the novel semiconductor device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 13A to 13D are cross-sectional views and circuit diagrams of semiconductor devices.

FIGS. 25A to 25D are Cs-corrected high-resolution TEM images of a plane of a CAAC-OS.

FIGS. 27A and 27B show electron diffraction patterns of a CAAC-OS.

DETAILED DESCRIPTION OF THE INVENTION

Figure 1A:
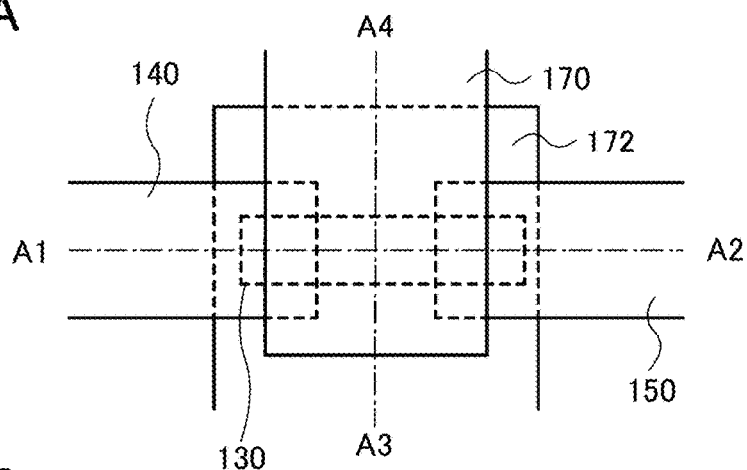
FIGS. 1A to 1C are a top view and cross-sectional views of a transistor.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. In addition, in the following embodiments and examples, the same portions or portions having similar functions are denoted by the same reference numerals in different drawings, and description thereof will not be repeated.

In a transistor of one embodiment of the present invention, silicon (including strained silicon), germanium, silicon germanium, silicon carbide, gallium arsenide, aluminum gallium arsenide, indium phosphide, gallium nitride, an organic semiconductor, an oxide semiconductor, or the like can be used for a channel formation region. It is particularly preferable to use an oxide semiconductor having a wider band gap than silicon for the channel formation region. In the description below, unless otherwise specified, a semiconductor device described as an example includes an oxide semiconductor in a channel formation region.

Embodiment 1

In this embodiment, a semiconductor device of one embodiment of the present invention is described with reference to drawings.
<Structure Example of Semiconductor Device>

Figure 1B:
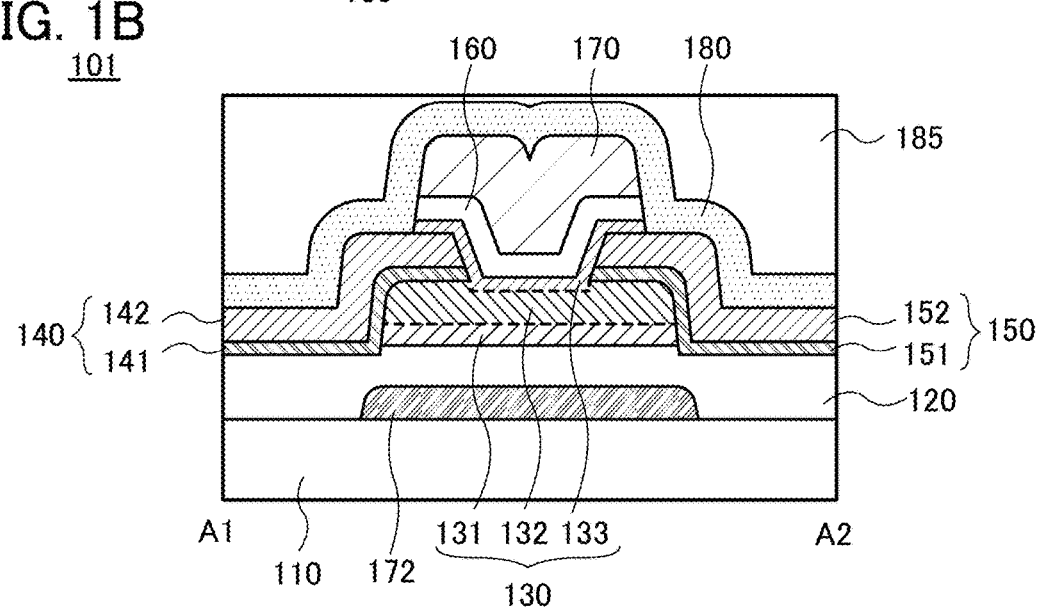
Figure 1C:
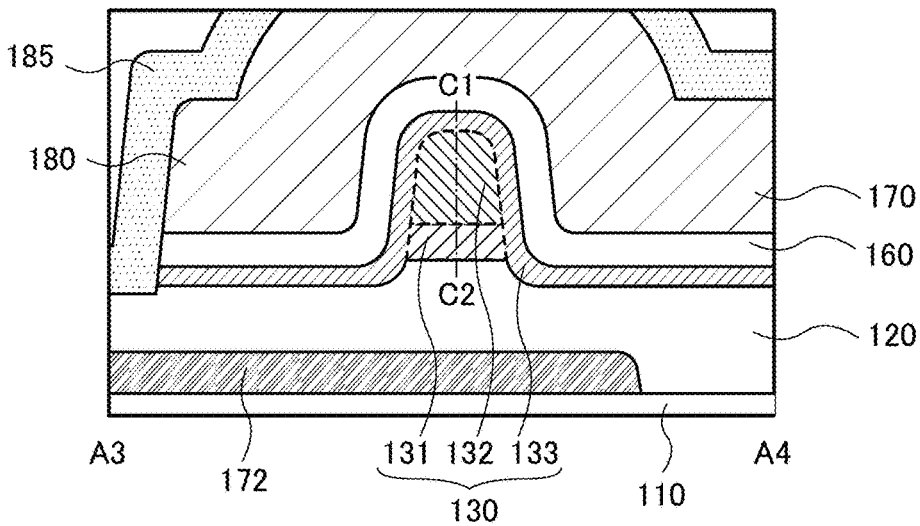

FIGS. 1A to 1C are a top view and cross-sectional views of a transistor 101 of one embodiment of the present invention. FIG. 1A is the top view. FIG. 1B illustrates a cross section in the direction of a dashed-dotted line A1-A2 in FIG. 1A. FIG. 1C illustrates a cross section in the direction of a dashed-dotted line A3-A4 in FIG. 1A. In FIGS. 1A to 1C, some components are enlarged, reduced in size, or omitted for easy understanding. In some cases, the direction of the dashed-dotted line A1-A2 is referred to as a channel length direction, and the direction of the dashed-dotted line A3-A4 is referred to as a channel width direction.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The transistor 101 includes a conductive film 172 over a substrate 110; an insulating film 120 over the substrate 110 and the conductive film 172; a stack which is provided over the insulating film 120 and formed of an oxide semiconductor 131 and an oxide semiconductor 132 that are formed in this order; a source electrode 140 and a drain electrode 150 which are electrically connected to part of the stack; an oxide semiconductor 133 covering part of the stack, part of the source electrode 140, and part of the drain electrode 150; and a gate insulating film 160 and a gate electrode 170 which overlap part of the stack, part of the source electrode 140, part of the drain electrode 150, and the oxide semiconductor 133. The source electrode 140 has a structure in which a conductive film 141 and a conductive film 142 are stacked in this order from the bottom. The drain electrode 150 includes a conductive film 151 and a conductive film 152 which are stacked in this order from the bottom. An insulating film 180 may be provided over the source electrode 140, the drain electrode 150, and the gate electrode 170. Furthermore, an insulating film 185 formed using oxide may be formed over the insulating film 180. The insulating film may be provided as needed and another insulating film may be further provided thereover. Note that the oxide semiconductors 131 to 133 are collectively referred to as an oxide semiconductor 130.

Note that at least part (or the whole) of the source electrode 140 (and/or the drain electrode 150) is provided on at least part (or the whole) of a surface, a side surface, a top surface, and/or a bottom surface of a semiconductor layer such as the oxide semiconductor 132 (and/or the oxide semiconductor 131).

Alternatively, at least part (or the whole) of the source electrode 140 (and/or the drain electrode 150) is in contact with at least part (or the whole) of a surface, a side surface, a top surface, and/or a bottom surface of a semiconductor layer such as the oxide semiconductor 132 (and/or the oxide semiconductor 131). Alternatively, at least part (or the whole) of the source electrode 140 (and/or the drain electrode 150) is in contact with at least part (or the whole) of a semiconductor layer such as the oxide semiconductor 132 (and/or the oxide semiconductor 131).

Alternatively, at least part (or the whole) of the source electrode 140 (and/or the drain electrode 150) is electrically connected to at least part (or the whole) of a surface, a side surface, a top surface, and/or a bottom surface of a semiconductor layer such as the oxide semiconductor 132 (and/or the oxide semiconductor 131). Alternatively, at least part (or the whole) of the source electrode 140 (and/or the drain electrode 150) is electrically connected to part (or the whole) of a semiconductor layer such as the oxide semiconductor 132 (and/or the oxide semiconductor 131).

Alternatively, at least part (or the whole) of the source electrode 140 (and/or the drain electrode 150) is provided near at least part (or the whole) of a surface, a side surface, a top surface, and/or a bottom surface of a semiconductor layer such as the oxide semiconductor 132 (and/or the oxide semiconductor 131). Alternatively, at least part (or the whole) of the source electrode 140 (and/or the drain electrode 150) is provided near part (or the whole) of a semiconductor layer such as the oxide semiconductor 132 (and/or the oxide semiconductor 131).

Alternatively, at least part (or the whole) of the source electrode 140 (and/or the drain electrode 150) is provided next to at least part (or the whole) of a surface, a side surface, a top surface, and/or a bottom surface of a semiconductor layer such as the oxide semiconductor 132 (and/or the oxide semiconductor 131). Alternatively, at least part (or the whole) of the source electrode 140 (and/or the drain electrode 150) is provided next to part (or the whole) of a semiconductor layer such as the oxide semiconductor 132 (and/or the oxide semiconductor 131).

Alternatively, at least part (or the whole) of the source electrode 140 (and/or the drain electrode 150) is provided obliquely above at least part (or the whole) of a surface, a side surface, a top surface, and/or a bottom surface of a semiconductor layer such as the oxide semiconductor 132 (and/or the oxide semiconductor 131). Alternatively, at least part (or the whole) of the source electrode 140 (and/or the drain electrode 150) is provided obliquely above part (or the whole) of a semiconductor layer such as the oxide semiconductor 132 (and/or the oxide semiconductor 131).

Alternatively, at least part (or the whole) of the source electrode 140 (and/or the drain electrode 150) is provided above at least part (or the whole) of a surface, a side surface, a top surface, and/or a bottom surface of a semiconductor layer such as the oxide semiconductor 132 (and/or the oxide semiconductor 131). Alternatively, at least part (or the whole) of the source electrode 140 (and/or the drain electrode 150) is provided above part (or the whole) of a semiconductor layer such as the oxide semiconductor 132 (and/or the oxide semiconductor 131).

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

The transistor of one embodiment of the present invention has a top-gate structure with a channel length of greater than or equal to 10 nm and less than or equal to 1000 nm, preferably greater than or equal to 20 nm and less than or equal to 500 nm, further preferably greater than or equal to 30 nm and less than or equal to 300 nm.

Furthermore, in the transistor 101, when the conductive film 172 is used as a second gate electrode (back gate), the on-state current can be further increased and the threshold voltage can be controlled. To increase the on-state current, for example, the gate electrode 170 and the conductive film 172 are set to have the same potential, and the transistor is driven as a dual-gate transistor. In addition, to control the threshold voltage, a fixed potential, which is different from a potential of the gate electrode 170, is supplied to the conductive film 172.

Figure 23A:
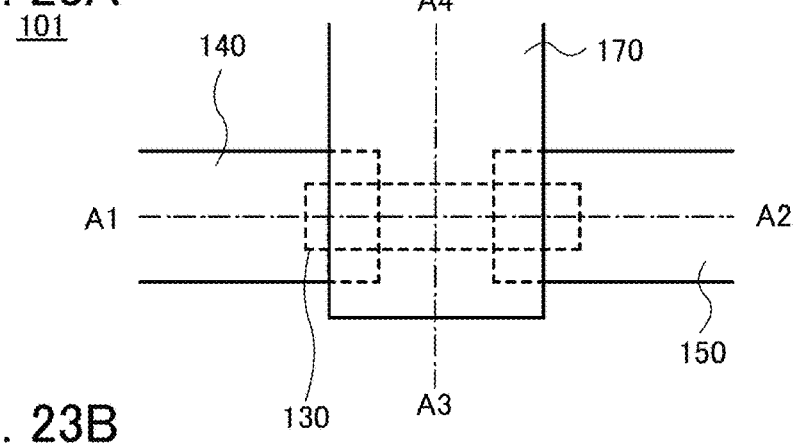
FIGS. 23A to 23C are a top view and cross-sectional views of a transistor.
Figure 23B:
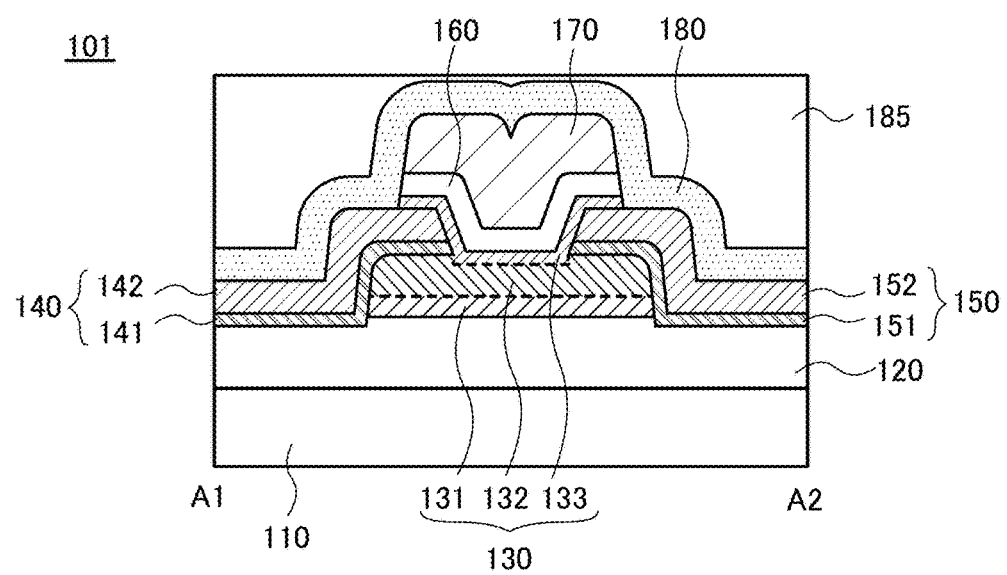
Figure 23C:
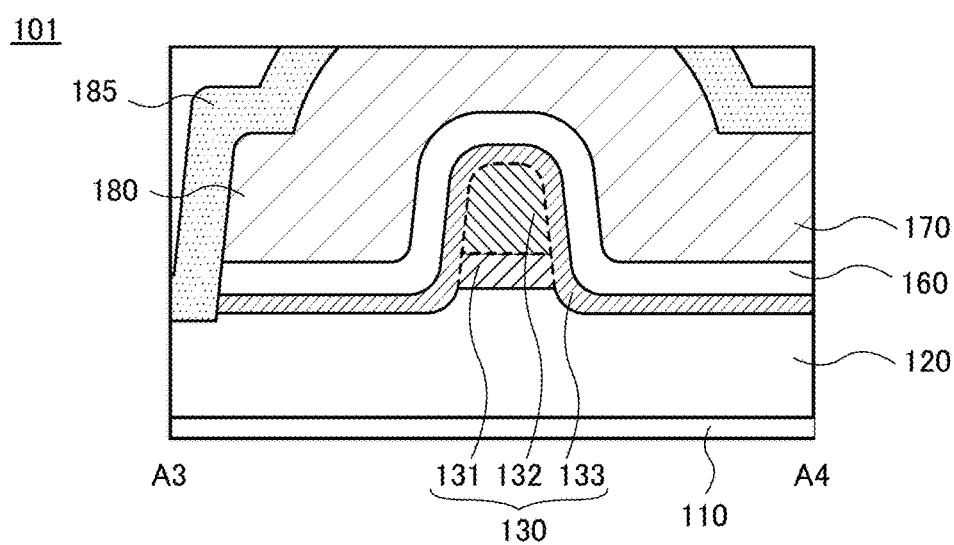

Note that the conductive film 172 may be omitted if not needed for operating the transistor 101. FIGS. 23A to 23C illustrate an example of a transistor obtained by removing the conductive film 172 from the transistor 101. Note that also in transistors described in embodiments below, in a similar manner, the conductive film 172 may be omitted if not needed.

The conductive films 141 and 151 in contact with the oxide semiconductors 131 and 132 in the transistor 101 are preferably formed using a Cu—X alloy film (X is Mn, Ni, Cr, Fe, Co, Mo, Ta, or Ti). The conductive films 141 and 151 in contact with the oxide semiconductors 131 and 132 are formed using a Cu—X alloy film and subjected to heat treatment, whereby X in the Cu—X alloy film may form an oxide film of X at the interface with the oxide semiconductor. The oxide film can inhibit Cu in the Cu—X alloy film from entering the oxide semiconductors 131 and 132. For the conductive films 142 and 152, a conductive film containing a low-resistance material such as copper (Cu), aluminum (Al), gold (Au), or silver (Ag), an alloy containing any of these materials, or a compound containing any of these materials as a main component is preferably used. Furthermore, to increase the conductivity of the source electrode 140 and the drain electrode 150, the thicknesses of the conductive films 142 and 152 are preferably larger than those of the conductive films 141 and 151, respectively.

The heat treatment may be performed at a temperature higher than or equal to 100° C. and lower than or equal to 1000° C., preferably higher than or equal to 200° C. and lower than or equal to 650° C., further preferably higher than or equal to 250° C. and lower than or equal to 500° C., and still further preferably higher than or equal to 250° C. and lower than or equal to 350° C. The heat treatment may be performed using heat which is applied to the substrate at the time of a deposition process (including a step for depositing the Cu—X alloy film and a deposition step performed after the step).

The source electrode 140 and the drain electrode 150 also function as lead wirings or the like. Therefore, the source electrode 140 and the drain electrode 150 each include a Cu—X alloy film and a conductive film containing a low-resistance material such as copper, aluminum, gold, or silver, whereby a semiconductor device in which wiring delay is reduced and which is capable of high-speed operation can be manufactured.

For example, a Cu—Mn alloy film is used as each of the conductive films 141 and 151, and a copper (Cu) film is used as each of the conductive films 142 and 152. Note that the Cu film means pure Cu, and the purity thereof is preferably higher than or equal to 99%. Pure Cu contains an impurity element at a small percentage in some cases. The conductive films 141 and 151 can be formed with a sputtering apparatus, for example. For example, a metal target containing Cu and Mn at a ratio of 90:10 [at. %] can be used in the sputtering apparatus.

When a Cu—Mn alloy film is used as each of the conductive films 141 and 151, adhesion with the insulating film 120 and adhesion with the oxide semiconductor 130 can be increased. Diffusion of Cu contained in the source electrode 140 and the drain electrode 150 into the oxide semiconductor 130 can be prevented by an oxide of Mn formed between the Cu—Mn alloy film and the oxide semiconductor 130. Furthermore, the use of the Cu—Mn alloy film enables the source electrode 140 and the drain electrode 150 to have a favorable ohmic contact with the oxide semiconductor 130.

When the source electrode 140 and the drain electrode 150 have the above structure, a copper (Cu) element can be prevented from entering the oxide semiconductor 130; as a result, a semiconductor device capable of high-speed operation can be provided.

It is preferable that the oxide semiconductor 130 include crystal parts, and that in each of the crystal parts, the c-axis be aligned in a direction parallel to a normal vector of a surface where the oxide semiconductor 130 is formed. In the case where the oxide semiconductor 130 has crystal parts, the entry of a Cu element contained in the source electrode 140 and the drain electrode 150 can be inhibited. Note that the oxide semiconductor 130 having crystal parts is preferably formed using a CAAC-OS, which is described later.

As illustrated in FIG. 1B, the thickness of a region of the oxide semiconductor 132 over which neither the source electrode 140 nor the drain electrode 150 is provided is smaller than the thicknesses of regions of the oxide semiconductor 132 over which the source electrode 140 and the drain electrode 150 are provided. In this manner, when the thickness of the region of the oxide semiconductor 132 over which neither the source electrode 140 nor the drain electrode 150 is provided is reduced, impurities (here, Cu) diffused from the source electrode 140 and the drain electrode 150 to be attached can be removed.

Thus, a surface of the oxide semiconductor 132, i.e., a surface of the channel of the transistor 101 is cleaned, so that a highly reliable semiconductor device in which a reduction in electrical characteristics is inhibited and which has preferable electrical characteristics can be provided.

In this manner, a Cu—Mn alloy film is used for a pair of electrodes functioning as a source electrode and a drain electrode of a transistor, and the thickness of a region of an oxide semiconductor over which the pair of electrodes is not provided is smaller than the thicknesses of regions of the oxide semiconductor over which the pair of electrodes is provided, whereby a semiconductor device with reduced wiring delay and favorable electrical characteristics can be obtained.

Figure 2A:
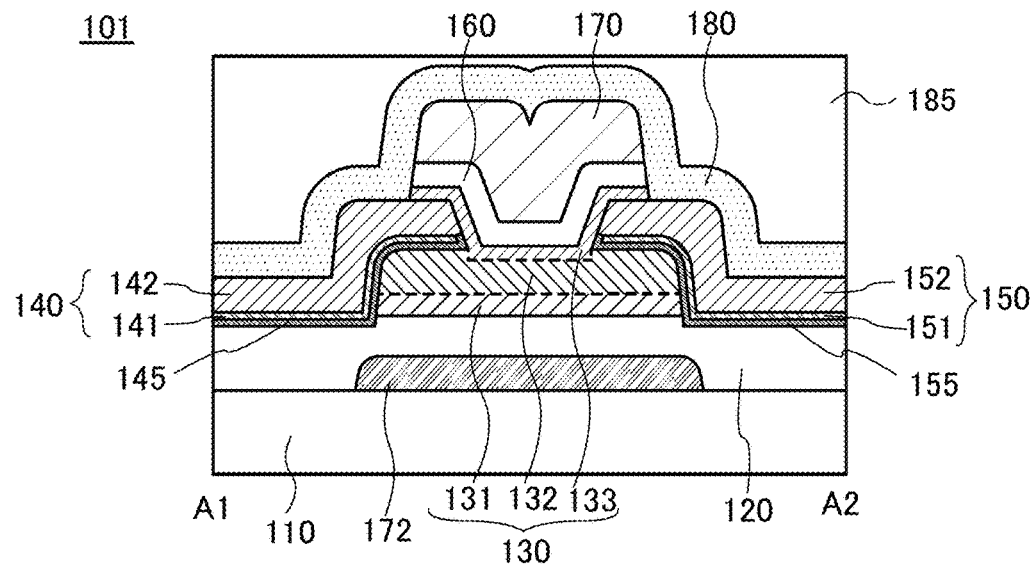
FIGS. 2A and 2B each illustrate a cross section of a transistor.

FIG. 2A is a cross-sectional view of the transistor 101 in the case where the source electrode 140 and the drain electrode 150 are subjected to heat treatment. Note that the cross-sectional view in FIG. 2A is different from that in FIG. 1B in that an oxide film 145 is formed at the boundaries between the conductive film 141 and each of the oxide semiconductor 130 and the insulating film 120, and an oxide film 155 is formed at the boundaries between the conductive film 151 and each of the oxide semiconductor 130 and the insulating film 120.

In the case where oxides (here, the oxide semiconductor 130 and the insulating film 120 containing oxygen) and conductive films containing a Cu—X alloy (the conductive films 141 and 151) are in contact with each other and heated, X in the Cu—X alloy is segregated in the vicinities of the interface between the oxides and the conductive films and reacts with oxygen, so that the oxide films 145 and 155 are formed. In the case where X is Mn, examples of a substance contained in the oxide films 145 and 155 include a Mn oxide, In—Mn oxide (in the case where the oxide semiconductor 130 contains In), Ga—Mn oxide (in the case where the oxide semiconductor 130 contains Ga), In—Ga—Mn oxide (in the case where the oxide semiconductor 130 contains In and Ga), In—Ga—Zn—Mn oxide (in the case where the oxide semiconductor 130 contains In, Ga, and Zn), Si—Mn oxide (in the case where the insulating film 120 contains silicon), Al—Mn oxide (in the case where the insulating film 120 contains aluminum), and Hf—Mn oxide (in the case where the insulating film 120 contains hafnium). A large amount of Mn contained in the Cu—Mn alloy reacts with oxygen to form the oxide films 145 and 155; therefore, the Mn concentration of each of the oxide films 145 and 155 is higher than that of each of the conductive films 141, 142, 151, and 152.

By the oxide films 145 and 155, Cu contained in the source electrode 140 and the drain electrode 150 can be prevented from diffusing to the outside of the electrodes and adversely affecting the oxide semiconductor 130. When the source electrode 140 and the drain electrode 150 have the above structure, a highly reliable semiconductor device with high conductivity can be provided.

Figure 2B:
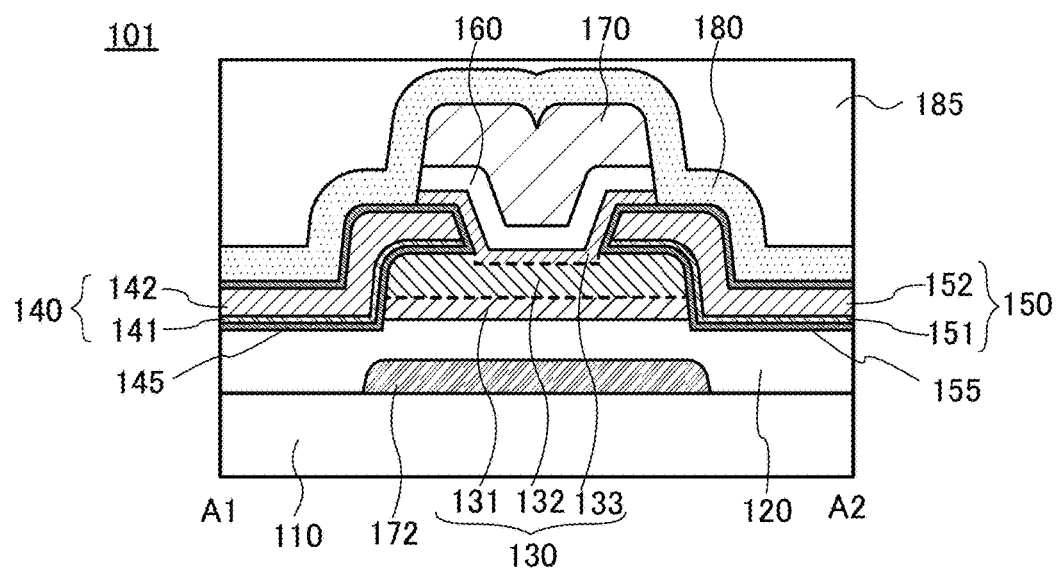

FIG. 2B is a cross-sectional view of the transistor 101. The cross-sectional view in FIG. 2B is different from that in FIG. 2A in that the oxide film 145 surrounds the source electrode 140 and the oxide film 155 surrounds the drain electrode 150. The oxide film 145 is formed on the top surface, the bottom surface, and the side surface of the source electrode 140, and the oxide film 155 is formed on the top surface, the bottom surface, and the side surface of the drain electrode 150. FIG. 2B illustrates an example in which a Cu—X alloy included in the conductive films 141 and 151 are attached to the top surfaces and the side surfaces of the conductive films 142 and 152 at the time of forming the conductive films 141 and 151 by etching, and then heat treatment is performed, whereby the oxide films 145 and 155 are also formed on the top surfaces and the side surfaces of the conductive films 142 and 152. The structure in which the oxide films 145 and 155 surround the electrodes containing Cu can further effectively inhibit diffusion of Cu.

Other constituent elements of the semiconductor device of this embodiment are described below in detail.

<Substrate>

The substrate 110 is not limited to a simple supporting substrate, and may be a substrate where another device such as a transistor is formed. In this case, at least one of the gate electrode 170, the source electrode 140, and the drain electrode 150 of the transistor may be electrically connected to the above device. An insulating film may be provided between the substrate 110 and the conductive film 172.

<Insulating Film>

The insulating film 120 can have a function of supplying oxygen to the oxide semiconductor 130 as well as a function of preventing diffusion of impurities from the substrate 110. For this reason, the insulating film 120 is preferably an insulating film containing oxygen and further preferably, the insulating film 120 is an insulating film containing oxygen in excess of the stoichiometric composition. For example, the insulating film 120 is a film of which the amount of released oxygen when converted into oxygen atoms is $1.0 \times 10^{19}$ atoms/cm$^3$ or more in thermal desorption spectroscopy (TDS) analysis. Note that the substrate temperature in the TDS analysis is preferably higher than or equal to 100° C. and lower than or equal to 700° C., or higher than or equal to 100° C. and lower than or equal to 500° C. Furthermore, in the case where another device is formed over the substrate 110 in the above manner or in the case where the conductive film 172 is formed over the substrate 110 in a manner similar to that described in this embodiment, the insulating film 120 is preferably subjected to chemical mechanical polishing (CMP) or the like so that the surface thereof is planarized.

For example, the insulating film 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film including silicon nitride, silicon nitride oxide, aluminum nitride, aluminum nitride oxide, or the like, or a mixed material of any of these.

<Oxide Semiconductor>

The oxide semiconductor 130 is typically an In—Ga oxide, an In—Zn oxide, or In-M-Zn oxide (M represents Ti, Ga, Y, Zr, La, Ce, Nd, Sn, or Hf). In particular, In-M-Zn oxide (M represents Ti, Ga, Y, Zr, La, Ce, Nd, Sn, or Hf) is preferably used as the oxide semiconductor 130.

Note that the oxide semiconductor 130 is not limited to an oxide containing indium. The oxide semiconductor 130 may be, for example, a Zn—Sn oxide or a Ga—Sn oxide.

In the case where the oxide semiconductor 130 is In-M-Zn oxide film (M represents Ti, Ga, Y, Zr, La, Ce, Nd, Sn, or Hf) formed by a sputtering method, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratio of metal elements in the oxide semiconductor 130 varies from the above atomic ratio of metal elements of the sputtering target within a range of ±40% as an error.

Figure 3:
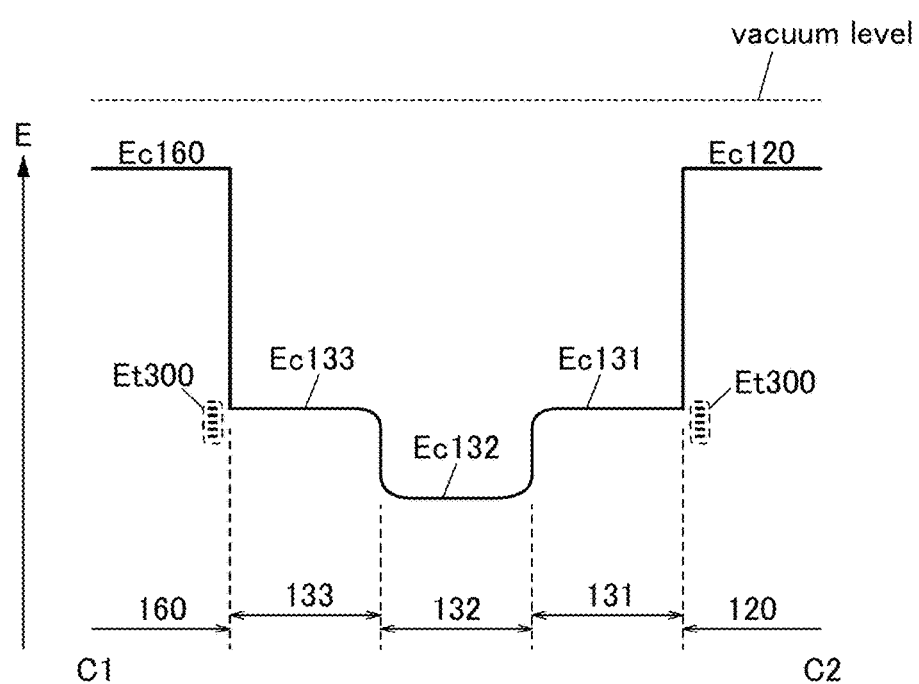
FIG. 3 illustrates a band structure of a transistor.

Next, a function and an effect of the oxide semiconductor 130 formed of stacked oxide semiconductors 131 to 133 are described using an energy band structure diagram in FIG. 3. FIG. 3 illustrates the energy band structure of a portion along a dashed dotted line C1-C2 in FIG. 1C. Furthermore, FIG. 3 illustrates the energy band structure of a channel formation region of the transistor 101.

In FIG. 3, Ec120, Ec131, Ec132, Ec133, and Ec160 indicate the energies of the bottoms of the conduction band of the insulating film 120, the oxide semiconductor 131, the oxide semiconductor 132, the oxide semiconductor 133, and the gate insulating film 160, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a sputtering target having an atomic ratio of In:Ga:Zn=1:3:2 has an energy gap of approximately 3.5 eV and an electron affinity of approximately 4.5 eV. An In—Ga—Zn oxide which is formed using a sputtering target having an atomic ratio of In:Ga:Zn=1:3:4 has an energy gap of approximately 3.4 eV and an electron affinity of approximately 4.5 eV. An In—Ga—Zn oxide which is formed using a sputtering target having an atomic ratio of In:Ga:Zn=1:3:6 has an energy gap of approximately 3.3 eV and an electron affinity of approximately 4.5 eV. An In—Ga—Zn oxide which is formed using a sputtering target having an atomic ratio of In:Ga:Zn=1:6:2 has an energy gap of approximately 3.9 eV and an electron affinity of approximately 4.3 eV. An In—Ga—Zn oxide which is formed using a sputtering target having an atomic ratio of In:Ga:Zn=1:6:8 has an energy gap of approximately 3.5 eV and an electron affinity of approximately 4.4 eV. An In—Ga—Zn oxide which is formed using a sputtering target having an atomic ratio of In:Ga:Zn=1:6:10 has an energy gap of approximately 3.5 eV and an electron affinity of approximately 4.5 eV. An In—Ga—Zn oxide which is formed using a sputtering target having an atomic ratio of In:Ga:Zn=1:1:1 has an energy gap of approximately 3.2 eV and an electron affinity of approximately 4.7 eV. An In—Ga—Zn oxide which is formed using a sputtering target having an atomic ratio of In:Ga:Zn=3:1:2 has an energy gap of approximately 2.8 eV and an electron affinity of approximately 5.0 eV.

Since the insulating film 120 and the gate insulating film 160 are insulators, Ec120 and Ec160 are closer to the vacuum level (have a smaller electron affinity) than Ec131, Ec132, and Ec133.

Furthermore, Ec131 is closer to the vacuum level than Ec132. Specifically, Ec131 is preferably located closer to the vacuum level than Ec132 by 0.05 eV or more, 0.07 eV or more, 0.1 eV or more, or 0.15 eV or more and 2 eV or less, 1 eV or less, 0.5 eV or less, or 0.4 eV or less.

In addition, Ec133 is closer to the vacuum level than Ec132. Specifically, Ec133 is preferably located closer to the vacuum level than Ec132 by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the oxide semiconductor 131 and the oxide semiconductor 132 and the vicinity of the interface between the oxide semiconductor 132 and the oxide semiconductor 133, mixed regions are formed; thus, the energy of the bottom of the conduction band continuously changes. In other words, no state or few states exist at these interfaces.

Accordingly, electrons transfer mainly through the oxide semiconductor 132 in the stacked-layer structure having the above energy band structure. Therefore, even when an interface state exists at the interface between the oxide semiconductor 131 and the insulating film 120 or the interface between the oxide semiconductor 133 and the gate insulating film 160, the interface state hardly influences the transfer of the electrons. In addition, since no interface state or few interface states exist at the interface between the oxide semiconductor 131 and the oxide semiconductor 132 and the interface between the oxide semiconductor 133 and the oxide semiconductor 132, the transfer of electrons is not interrupted in the regions. Accordingly, high field-effect mobility can be obtained in the transistor 101 having the above stacked-layer structure of the oxide semiconductors.

Note that although trap states Et300 due to impurities or defects might be formed in the vicinity of the interface between the oxide semiconductor 131 and the insulating film 120 and in the vicinity of the interface between the oxide semiconductor 133 and the gate insulating film 160 as illustrated in FIG. 3, the oxide semiconductor 132 can be separated from the trap states owing to the existence of the oxide semiconductors 131 and 133.

In the transistor 101 described in this embodiment, in the channel width direction, the top surfaces and the side surface of the oxide semiconductor 132 are in contact with the oxide semiconductor 133, and the bottom surface of the oxide semiconductor 132 is in contact with the oxide semiconductor 131 (see FIG. 1C). In this manner, the oxide semiconductor 132 is surrounded by the oxide semiconductors 131 and 133, whereby the influence of the trap states can be further reduced.

However, when the energy difference between Ec131 and Ec132 or the energy difference between Ec133 and Ec132 is small, an electron in the oxide semiconductor 132 might reach the trap state by passing over the energy difference. Since the electron is trapped at the trap state, a negative fixed charge is generated at the interface with the insulating film, causing the threshold voltage of the transistor to be shifted in the positive direction.

Therefore, each of the energy differences between Ec131 and Ec132 and between Ec133 and Ec132 is preferably set to be larger than or equal to 0.1 eV, further preferably larger than or equal to 0.15 eV, in which case a change in the threshold voltage of the transistor can be reduced and the transistor can have favorable electrical characteristics.

Each of the oxide semiconductors 131 and 133 preferably has a wider band gap than the oxide semiconductor 132.

For the oxide semiconductors 131 and 133, for example, a material containing Al, Ti, Ga, Ge, Y, Zr, Sn, La, Ce, or Hf with a higher atomic ratio than that used for the oxide semiconductor 132 can be used. Specifically, the atomic ratio of any of the above metal elements in the oxide semiconductors 131 and 133 is 1.5 times or more, preferably 2 times or more, more preferably 3 times or more as much as that in the oxide semiconductor 132. Any of the above metal elements is strongly bonded to oxygen and thus has a function of preventing generation of oxygen vacancy in the oxide semiconductor. That is, oxygen vacancy is less likely to be generated in the oxide semiconductors 131 and 133 than in the oxide semiconductor 132.

Note that when each of the oxide semiconductors 131 to 133 is an In-M-Zn oxide containing at least indium, zinc, and M (M is a metal such as Al, Ti, Ga, Ge, Y, Zr, Sn, La, Ce, or Hf), and the oxide semiconductor 131 has an atomic ratio of In:M:Zn=$x_1$:$y_1$:$z_1$, the oxide semiconductor 132 has an atomic ratio of In:M:Zn=$x_2$:$y_2$:$z_2$, and the oxide semiconductor 133 has an atomic ratio of In:M:Zn=$x_3$:$y_3$:$z_3$, each of $y_1/x_1$ and $y_3/x_3$ is preferably larger than $y_2/x_2$. Each of $y_1/x_1$ and $y_3/x_3$ is 1.5 times or more as large as $y_2/x_2$, preferably 2 times or more, more preferably 3 times or more as large as $y_2/x_2$. At this time, when $y_2$ is greater than or equal to $x_2$ in the oxide semiconductor 132, a transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductors 131 and 133 are preferably less than 50 at. % and greater than or equal to 50 at. %, respectively, and further preferably less than 25 at. % and greater than or equal to 75 at. %, respectively. Furthermore, in the case where Zn and O are not taken into consideration, the proportion of In and the proportion of M in the oxide semiconductor 132 are preferably greater than or equal to 25 at. % and less than 75 at. %, respectively, further preferably greater than or equal to 34 at. % and less than 66 at. %, respectively.

The thicknesses of the oxide semiconductors 131 and 133 are each greater than or equal to 3 nm and less than or equal to 100 nm, and preferably greater than or equal to 3 nm and less than or equal to 50 nm. The thickness of the oxide semiconductor 132 is greater than or equal to 3 nm and less than or equal to 200 nm, preferably greater than or equal to 3 nm and less than or equal to 100 nm, and further preferably greater than or equal to 3 nm and less than or equal to 50 nm. In addition, the oxide semiconductor 132 is preferably thicker than the oxide semiconductors 131 and 133.

Note that stable electrical characteristics can be effectively imparted to a transistor in which an oxide semiconductor serves as a channel by reducing the concentration of impurities in the oxide semiconductor to make the oxide semiconductor intrinsic or substantially intrinsic. The term "substantially intrinsic" refers to the state where an oxide semiconductor has a carrier density lower than $1\times10^{17}/cm^3$, preferably lower than $1\times10^{15}/cm^3$, and further preferably lower than $1\times10^{13}/cm^3$.

In the oxide semiconductor, hydrogen, nitrogen, carbon, silicon, and metal elements except for main components are impurities. For example, hydrogen and nitrogen form donor levels to increase the carrier density. In addition, silicon in the oxide semiconductor forms an impurity level. The impurity level becomes a trap, which might deteriorate the electric characteristics of the transistor. Therefore, it is preferable to reduce the concentration of the impurities in the oxide semiconductors 131 to 133 and at interfaces between the oxide semiconductors.

In order to make the oxide semiconductor intrinsic or substantially intrinsic, for example, the concentration of silicon at a certain depth of the oxide semiconductor or in a certain region of the oxide semiconductor, which is measured by secondary ion mass spectrometry (SIMS), is higher than or equal to $1\times10^{16}$ atoms/$cm^3$ and lower than $1\times10^{19}$ atoms/$cm^3$, preferably higher than or equal to $1\times10^{16}$ atoms/$cm^3$ and lower than $5\times10^{18}$ atoms/$cm^3$, and further preferably higher than or equal to $1\times10^{16}$ atoms/$cm^3$ and lower than $1\times10^{18}$ atoms/$cm^3$. Furthermore, the concentration of hydrogen at a certain depth of the oxide semiconductor or in a certain region of the oxide semiconductor is higher than or equal to $1\times10^{16}$ atoms/$cm^3$ and lower than or equal to $2\times10^{20}$ atoms/$cm^3$, preferably higher than or equal to $1\times10^{16}$ atoms/$cm^3$ and lower than or equal to $5\times10^{19}$ atoms/$cm^3$, further preferably higher than or equal to $1\times10^{16}$ atoms/$cm^3$ and lower than or equal to $1\times10^{19}$ atoms/$cm^3$, and still further preferably higher than or equal to $1\times10^{16}$ atoms/$cm^3$ and lower than or equal to $5\times10^{18}$ atoms/$cm^3$. Moreover, the concentration of nitrogen at a certain depth of the oxide semiconductor or in a certain region of the oxide semiconductor is higher than or equal to $1\times10^{16}$ atoms/$cm^3$ and lower than $5\times10^{19}$ atoms/$cm^3$, preferably higher than or equal to $1\times10^{16}$ atoms/$cm^3$ and lower than or equal to $5\times10^{18}$ atoms/$cm^3$, further preferably higher than or equal to $1\times10^{16}$ atoms/$cm^3$ and lower than or equal to $1\times10^{18}$ atoms/$cm^3$, and still further preferably higher than or equal to $1\times10^{16}$ atoms/$cm^3$ and lower than or equal to $5\times10^{17}$ atoms/$cm^3$.

In addition, in a case where the oxide semiconductor layer includes a crystal, the crystallinity of the oxide semiconductor layer might be decreased if silicon or carbon is included at high concentration. In order not to lower the crystallinity of the oxide semiconductor, for example, the concentration of silicon at a certain depth of the oxide semiconductor or in a certain region of the oxide semiconductor may be higher than or equal to $1\times10^{16}$ atoms/$cm^3$ and lower than $1\times10^{19}$ atoms/$cm^3$, preferably higher than or equal to $1\times10^{16}$ atoms/$cm^3$ and lower than $5\times10^{18}$ atoms/$cm^3$, and further preferably higher than or equal to $1\times10^{16}$ atoms/$cm^3$ and lower than $1\times10^{18}$ atoms/$cm^3$. Furthermore, the concentration of carbon at a certain depth of the oxide semiconductor or in a certain region of the oxide semiconductor may be higher than or equal to $1\times10^{16}$ atoms/$cm^3$ and lower than $1\times10^{19}$ atoms/$cm^3$, preferably higher than or equal to $1\times10^{16}$ atoms/$cm^3$ and lower than $5\times10^{18}$ atoms/$cm^3$, and further preferably higher than or equal to $1\times10^{16}$ atoms/$cm^3$ and lower than $1\times10^{18}$ atoms/$cm^3$, for example.

A transistor in which a highly purified oxide semiconductor is used for a channel formation region as described above has an extremely low off-state current. In the case where the voltage between a source and a drain is set at approximately 0.1 V, 5 V, or 10 V, for example, the off-state current standardized on the channel width of the transistor can be as low as $10^{-24}$ A/μm to $10^{-29}$ A/μm.

In the transistor 101 described in this embodiment as an example, the gate electrode 170 is formed to electrically surround the oxide semiconductor 132 in the channel width direction; accordingly, a gate electric field is applied to the semiconductor 132 in the side surface direction in addition to the perpendicular direction (see FIG. 1C). In other words, a gate electric field is applied to the oxide semiconductor 132 entirely, so that current flows in the whole of the oxide semiconductor 132 serving as a channel, leading to a further increase in on-state current.

<Conductive Film>

The gate electrode 170 and the conductive film 172 are each can be formed using a material containing a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy containing any of these metal element; or an alloy film containing a combination of any of these elements. Moreover, the gate electrode 170 and the conductive film 172 may each have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The gate electrode 170 and conductive film 172 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layered structure formed using the above light-transmitting conductive material and the above metal element.

<Gate Insulating Film>

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack of any of the above materials. The gate insulating film 160 may contain lanthanum (La), nitrogen, or zirconium (Zr) as an impurity.

An example of a stacked-layer structure of the gate insulating film 160 is described. The gate insulating film 160 includes, for example, oxygen, nitrogen, silicon, or hafnium. Specifically, it is preferable that the gate insulating film 160 contain hafnium oxide and silicon oxide or silicon oxynitride.

Hafnium oxide has a higher dielectric constant than silicon oxide and silicon oxynitride. Therefore, by using hafnium oxide or aluminum oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current.

<Protective Insulating Film>

The insulating film 180 has a function of blocking oxygen, hydrogen, water, an alkali metal, an alkaline earth metal, or the like. It is possible to prevent outward diffusion of oxygen from the oxide semiconductor 130 and entry of hydrogen, water, or the like into the oxide semiconductor 130 from the outside by providing the insulating film 180. For the insulating film 180, a nitride insulating film can be used, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 180 because an aluminum oxide film has a high blocking effect of preventing transmission of both oxygen and impurities such as hydrogen and moisture. Accordingly, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor 130, preventing release of oxygen, which is a main component of the oxide semiconductor 130, from the oxide semiconductor, and preventing unnecessary release of oxygen from the insulating film 120. In addition, oxygen contained in the aluminum oxide film can be diffused into the oxide semiconductor.

<Interlayer Insulating Film>

The insulating film 185 is preferably formed over the insulating film 180. The insulating film 185 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating film may be a stack of any of the above materials.

<Manufacturing Method>

Next, a method for manufacturing the transistor 101 described in this embodiment is described with reference to FIGS. 4A to 4D, FIGS. 5A to 5C, FIGS. 6A to 6C, and FIGS. 7A and 7B. In FIGS. 4A to 4D, FIGS. 5A to 5C, FIGS. 6A to 6C, and FIGS. 7A and 7B, a cross section of the transistor in the channel length direction is shown on the left side, and a cross section of the transistor in the channel width direction is shown on the right side.

Figure 4A:
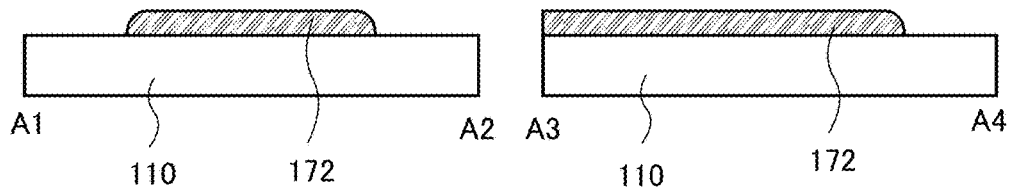
FIGS. 4A to 4D illustrate a method for manufacturing a transistor.

First, a conductive film is formed over the substrate 110 and processed through a photolithography process and an etching process to form the conductive film 172 (see FIG. 4A). The conductive film 172 can be formed by a sputtering method, a chemical vapor deposition (CVD) method, a vacuum evaporation method, or a pulsed laser deposition (PLD) method. Alternatively, a coating method or a printing method can be used. Although typical deposition methods are a sputtering method and a plasma enhanced chemical vapor deposition (PECVD) method, a thermal CVD method such as a metal organic chemical vapor deposition (MOCVD) method or an atomic layer deposition (ALD) method may be used.

Figure 4B:
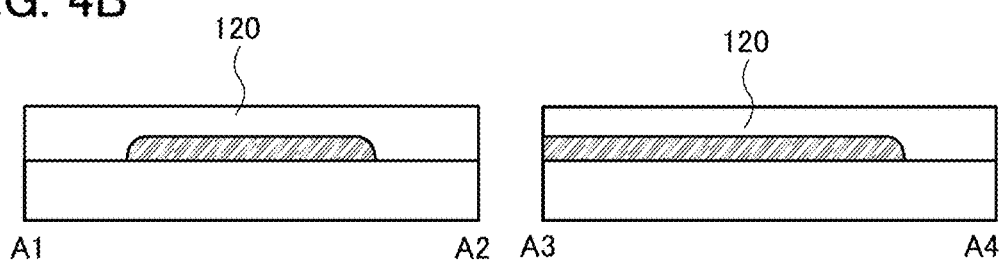

Next, an insulating film is deposited over the conductive film 172 and a surface of the insulating film is planarized by a CMP method, whereby the insulating film 120 is formed (see FIG. 4B). The insulating film 120 can be formed by a sputtering method, a PECVD method, a thermal CVD method, a vacuum evaporation method, a PLD method, or the like.

Oxygen may be added to the insulating film 120 by an ion implantation method, an ion doping method, a plasma immersion ion implantation method, or the like. Adding oxygen enables the insulating film 120 to supply oxygen much easily to the oxide semiconductor 130.

Figure 4C:
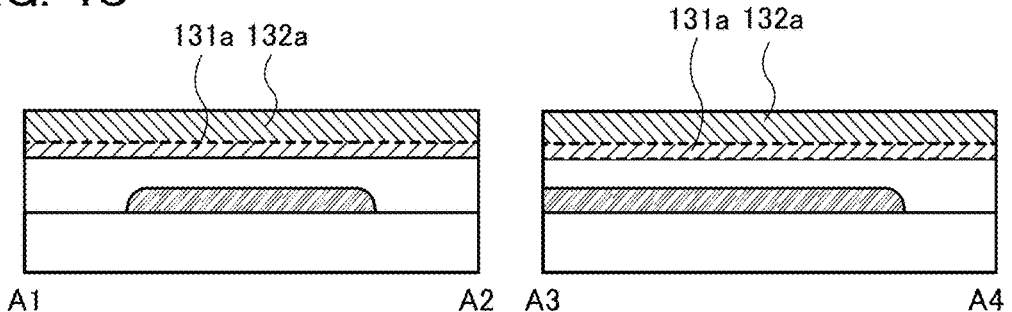
Figure 4D:
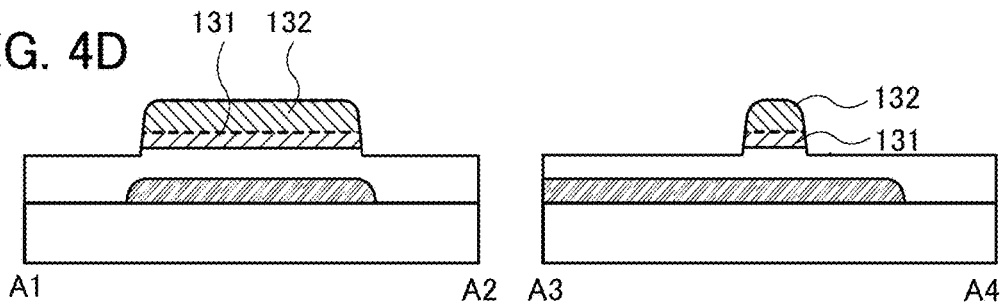

Next, a first oxide semiconductor film 131a to be the oxide semiconductor 131 and a second oxide semiconductor film 132a to be the oxide semiconductor 132 are formed over the insulating film 120 by a sputtering method, a CVD method, an MBE method, or the like (see FIG. 4C).

After the oxide semiconductor film 132a is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor films 131a and 132a can be improved, and in addition, impurities such as hydrogen and water can be removed from the insulating film 120 and the oxide semiconductor films 131a and 132a. Note that the first heat treatment may be performed after formation of the oxide semiconductors 131 and 132 described later Next, a first resist mask is formed over the oxide semiconductor film 132a. It is preferable that the resist mask be formed by a photolithography process using electron beam exposure, liquid immersion exposure, or EUV exposure, for example. At this time, using a negative photoresist material for forming the first resist mask can shorten the time needed for the light exposure step. The oxide semiconductor films 131a and 132a are selectively etched using the resist mask to form the oxide semiconductors 131 and 132 (see FIG. 4D).

Figure 5A:
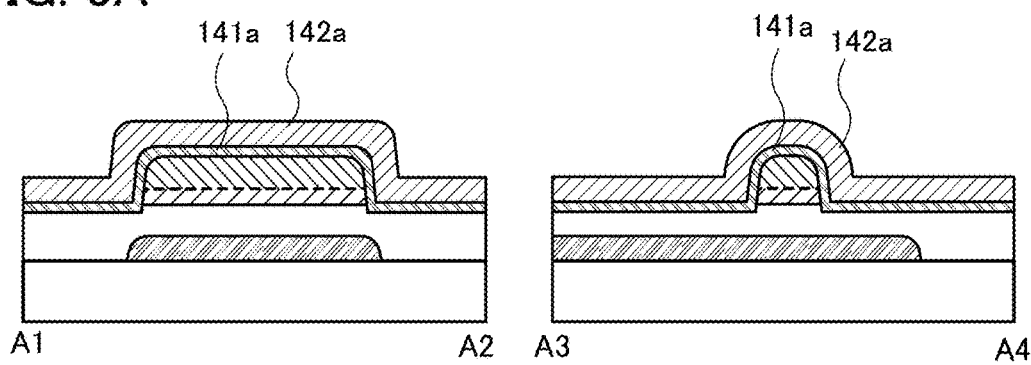
FIGS. 5A to 5C illustrate a method for manufacturing a transistor.

Next, conductive films 141a and 142a are formed over the insulating film 120 and the oxide semiconductor 132 (see FIG. 5A). Note that the conductive film 141a is processed into the conductive films 141 and 151 and the conductive film 142a is processed into the conductive films 142 and 152 in a later step.

The conductive film 141a can be formed using a material selected from the above-described materials that can be used for the source electrode 140 and the drain electrode 150. A Cu—Mn alloy film is used as the conductive film 141a in this embodiment. The Cu—Mn alloy film can be formed by a sputtering method using a Cu—Mn metal target (Cu: Mn=90:10 [at. %]). A Cu film is formed as the conductive film 142a by a sputtering method. It is preferable that the thickness of the conductive film 142a be larger than that of the conductive film 141a.

Figure 5B:
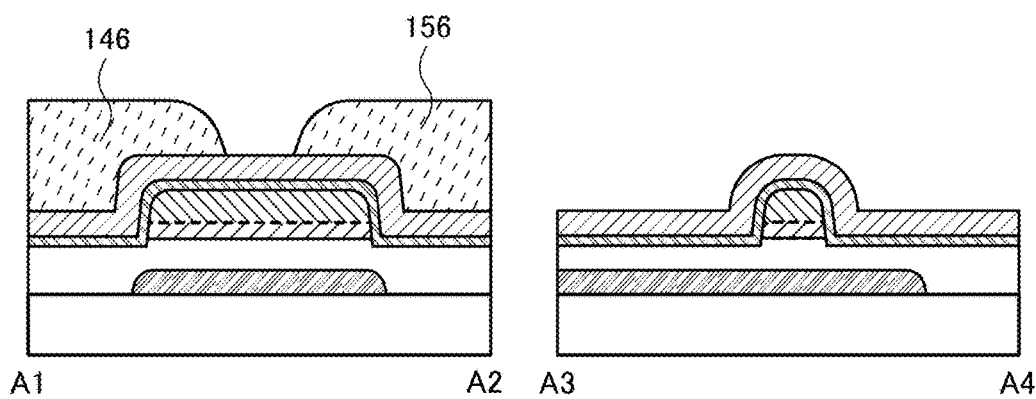

Next, a resist is applied over the conductive film 142a and is patterned, whereby resist masks 146 and 156 are formed in desired regions (see FIG. 5B).

Figure 5C:
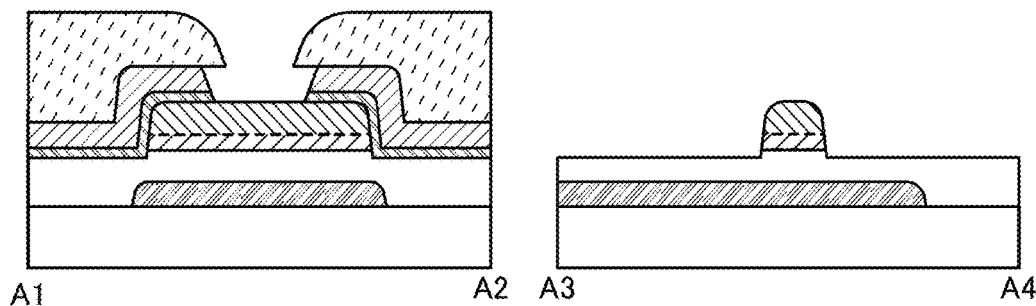

Next, an etchant is applied over the resist masks 146 and 156 to etch the conductive films 141a and 142a (see FIG. 5C). Examples of the etchant used for etching the conductive films 141a and 142a include an etchant containing an organic acid solution and hydrogen peroxide water.

Figure 6A:
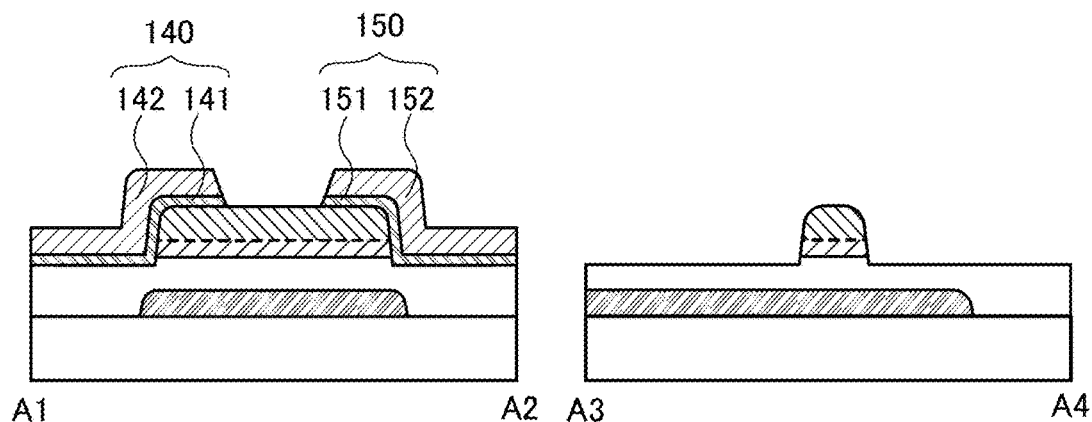
FIGS. 6A to 6C illustrate a method for manufacturing a transistor.

Then, the resist masks 146 and 156 are removed, whereby the source electrode 140 including the conductive films 141 and 142 and the drain electrode 150 including the conductive films 151 and 152 are formed (see FIG. 6A). The resist masks 146 and 156 can be removed using, for example, a resist peeling apparatus.

Figure 6B:
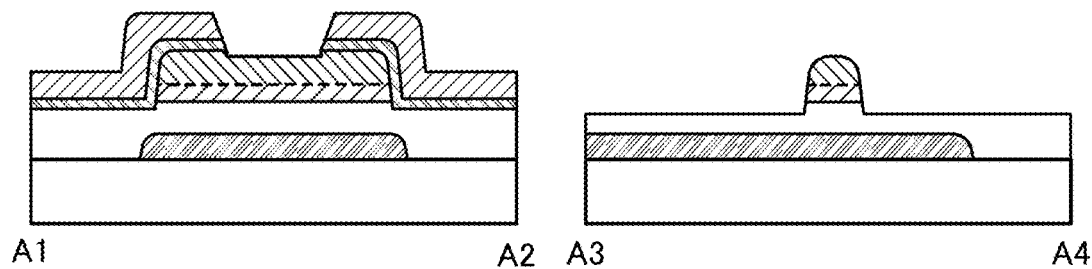

After that, an etchant is applied to the source electrode 140, the drain electrode 150, and the oxide semiconductors 131 and 132, whereby part of surfaces of the oxide semiconductors 131 and 132 which are exposed between the source electrode 140 and the drain electrode 150 is etched (see FIG. 6B). At the same time, the insulating film 120 is also etched depending on the etchant.

As the etchant, for example, a dilution of an acid-based chemical solution such as phosphoric acid, nitric acid, hydrofluoric acid, hydrochloric acid, sulfuric acid, acetic acid, or oxalic acid can be used. Note that the etchant 164 is not limited to the above acid-based chemical solutions. For example, a chemical solution with which the etching rate of the source electrode 140 and the drain electrode 150 is lower than that of the oxide semiconductors 131 and 132 may be used as the etchant 164. Specifically, a mixed solution of phosphoric acid, a chelating agent (e.g., ethylenediaminetetraacetic acid (EDTA)), and aromatic-compound-based anticorrosive (e.g., benzotriazole (BTA)) can be used.

The treatment using the etchant can remove part of the constituent elements of the conductive films 141a and 142a which are attached to the surface of the oxide semiconductors 131 and 132.

Next, a third oxide semiconductor film 133a to be the oxide semiconductor 133 is formed over the oxide semiconductors 131 and 132, the source electrode 140, and the drain electrode 150 by a sputtering method, a CVD method, an MBE method, or the like.

Next, an insulating film 160a to be the gate insulating film 160 is formed over the oxide semiconductor film 133a. The insulating film 160a can be formed by a sputtering method, a PECVD method, a thermal CVD method, a vacuum evaporation method, a PLD method, or the like.

Then, a conductive film 170a to be the gate electrode 170 is formed over the insulating film 160a. The conductive film 170a can be formed by a sputtering method, a PECVD method, a thermal CVD method, a vacuum evaporation method, a PLD method, or the like.

Figure 6C:
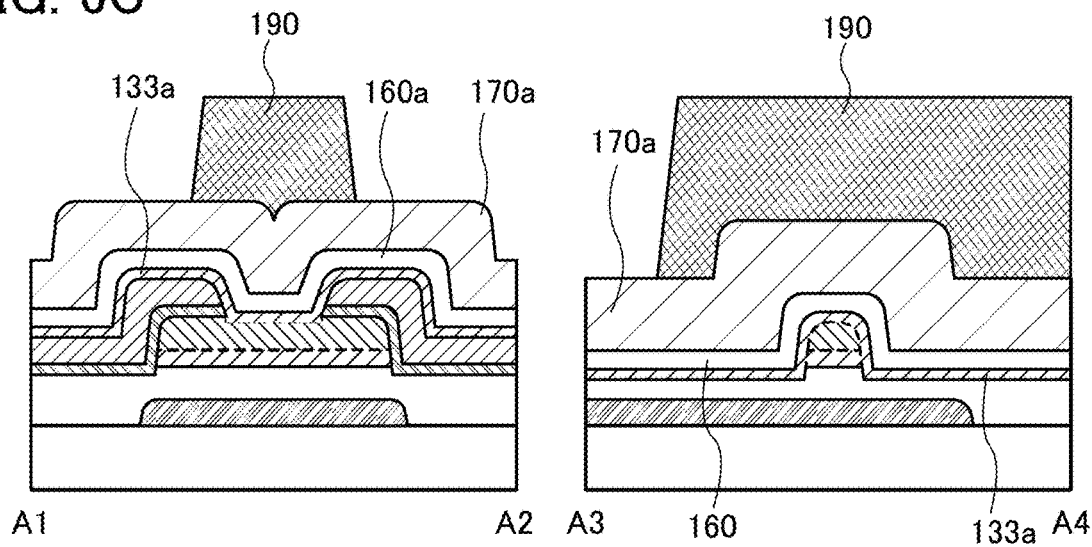

Next, a resist mask 190 is formed over the conductive film 170a (see FIG. 6C). Then, the conductive film 170a is selectively etched using the resist mask to form the gate electrode 170.

Then, the insulating film 160a is selectively etched using the gate electrode 170 as a mask to form the gate insulating film 160.

Figure 7A:
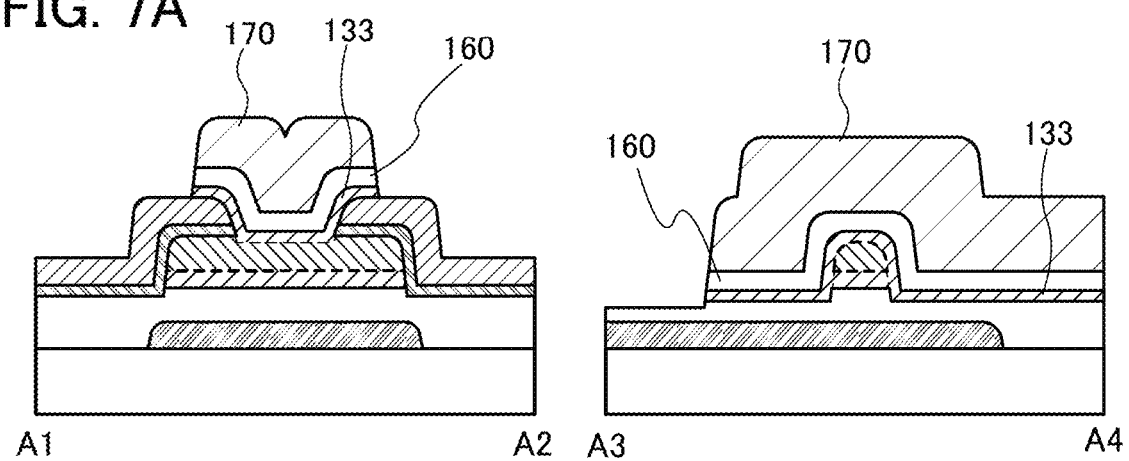
FIGS. 7A and 7B illustrate a method for manufacturing a transistor.

After that, the oxide semiconductor film 133a is etched using the gate electrode 170 or the gate insulating film 160 as a mask to form the oxide semiconductor 133 (see FIG. 7A).

The conductive film 170a, the insulating film 160a, and the oxide semiconductor film 133a may be etched individually or successively. Furthermore, either dry etching or wet etching may be used as the etching method, and an appropriate etching method may be selected individually.

Figure 7B:
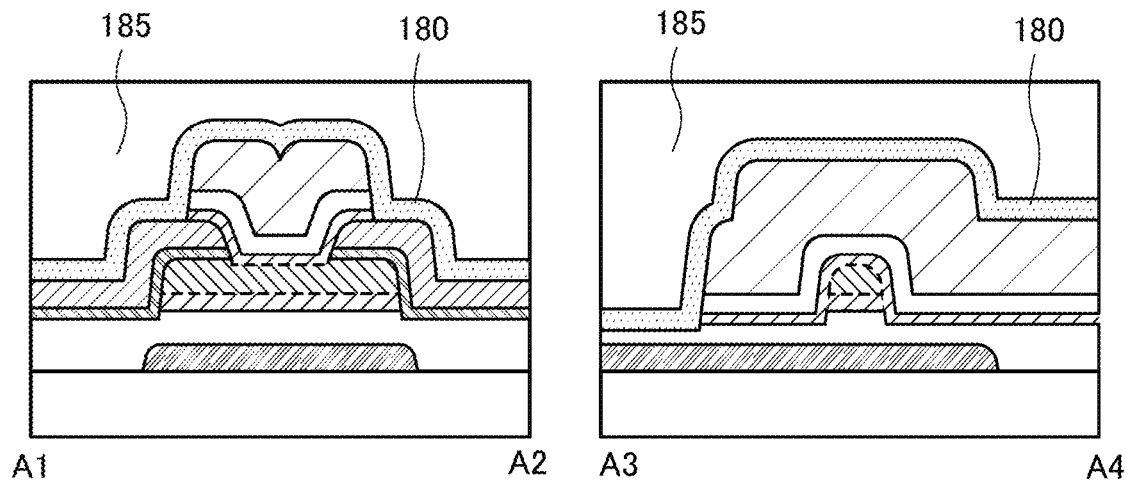

Next, the insulating film 180 and the insulating film 185 are formed over the source electrode 140, the drain electrode 150, and the gate electrode 170 (see FIG. 7B). The insulating film 180 and the insulating film 185 can be formed by a sputtering method, a PECVD method, a thermal CVD method, a vacuum evaporation method, a PLD method, or the like.

Oxygen may be added to the insulating film 180 and/or the insulating film 185 by an ion implantation method, an ion doping method, a plasma immersion ion implantation method, or the like. Adding oxygen enables the insulating film 180 and/or the insulating film 185 to supply oxygen much easily to the oxide semiconductor 130.

Next, second heat treatment is performed. The second heat treatment may be performed after the deposition of the insulating film 180 or the insulating film 185, at a temperature higher than or equal to 100° C. and lower than or equal to 1000° C., preferably higher than or equal to 200° C. and lower than or equal to 650° C., further preferably higher than or equal to 250° C. and lower than or equal to 500° C., and still further preferably higher than or equal to 250° C. and lower than or equal to 350° C., in an inert gas atmosphere, an atmosphere containing an oxidizing gas at 10 ppm or more, or a reduced pressure state. By the second heat treatment, excess oxygen is easily released from the insulating film 120, the insulating film 180, and the insulating film 185, so that the amount of oxygen vacancy in the oxide semiconductor 130 can be reduced.

For example, in the case where a Cu—Mn alloy film is used as each of the conductive films 141 and 151, and a Cu film is used as each of the conductive films 142 and 152, when the second heat treatment is performed, Mn in the Cu—Mn alloy film forms an manganese oxide at the interface with the oxide semiconductor or the interface with the insulating film containing oxygen. The manganese oxide can inhibit Cu from entering the oxide semiconductors 131 and 132.

Through the above process, the transistor 101 illustrated in FIGS. 1A to 1C can be manufactured.

Although the variety of films such as the metal films, the semiconductor films, and the inorganic insulating films which are described in this embodiment typically can be formed by a sputtering method or a plasma CVD method, such films may be formed by another method, e.g., a thermal CVD method. An MOCVD method or an ALD method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

Various films such as metal films, semiconductor films, and inorganic insulating films described in the above embodiment can be formed by a thermal CVD method such as a MOCVD method or an ALD method. For example, in the case where an In—Ga—Zn—O film is formed, trimethylindium, trimethylgallium, and diethylzinc can be used. Note that the chemical formula of trimethylindium is $In(CH_3)_3$. Note that the chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. In addition, instead of an $In(CH_3)_3$ gas, an $In(C_2H_5)_3$ gas may be used. Alternatively, a $Zn(CH_3)_2$ gas may be used.

Note that this embodiment can be combined with other embodiments and an embodiment in this specification as appropriate.

Embodiment 2

In this embodiment, transistors 102 and 103 of one embodiment of the present invention are described with reference to FIGS. 8A and 8B.

Figure 8A:
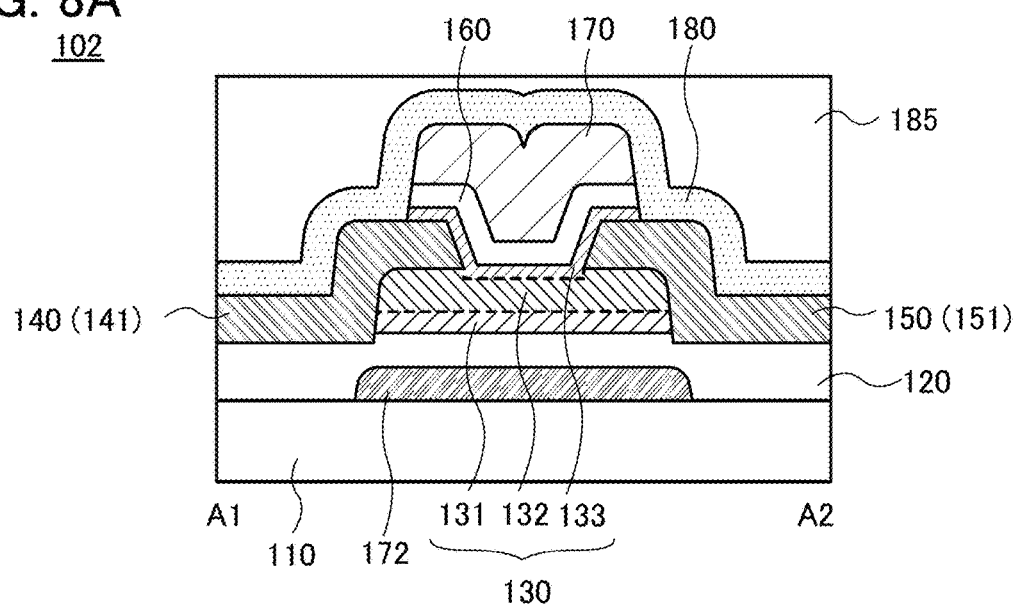
FIGS. 8A and 8B each illustrate a cross section of a transistor.

FIG. 8A is a cross-sectional view in the channel length direction of the transistor 102 of one embodiment of the present invention. The transistor 102 has a structure of the transistor 101 described in Embodiment 1 in which the source electrode 140 is formed of only a single layer of the conductive film 141, and the drain electrode 150 is formed of only a single layer of the conductive film 151.

In a manner similar to that in the transistor 101, it is preferable that a Cu—X alloy film be used as each of the conductive film 141 and the conductive film 151 in the transistor 102.

Since the source electrode 140 and the drain electrode 150 each have only a single layer, the manufacturing process of the transistor 102 is more simple than that of the transistor 101.

Figure 8B:
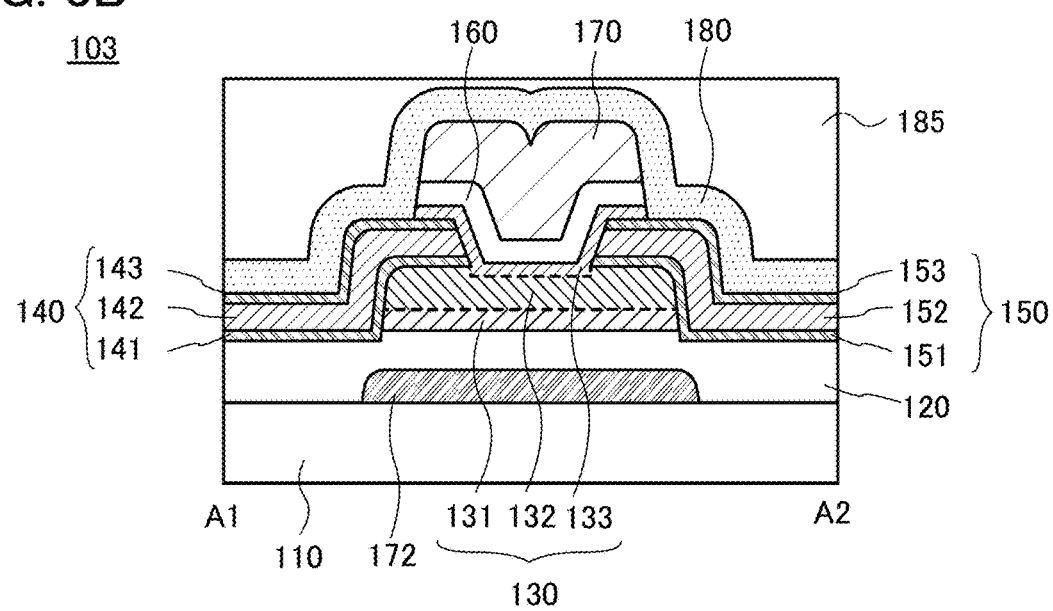

FIG. 8B is a cross-sectional view in the channel length direction of the transistor 103 of one embodiment of the present invention. The transistor 103 has a structure of the transistor 101 described in Embodiment 1 in which the source electrode 140 is formed of the conductive film 141, the conductive film 142, and a conductive film 143 which are stacked in this order from the bottom, and the drain electrode 150 is formed of the conductive film 151, the conductive film 152, and a conductive film 153 which are stacked in this order from the bottom.

In a manner similar to that in the transistor 101, it is preferable that a Cu—X alloy film be used as each of the conductive film 141 and the conductive film 151 in the transistor 103. For the conductive films 142 and 152 of the transistor 103, a conductive film containing a low-resistance material such as copper (Cu), aluminum (Al), gold (Au), or silver (Ag), an alloy containing any of these materials, or a compound containing any of these materials as a main component is preferably used.

A Cu—X alloy film is preferably used as each of the conductive films 143 and 153. When a Cu—X alloy film is used as each of the conductive films 143 and 153, adhesion between the source electrode 140 and the insulating film 180 and between the drain electrode 150 and the insulating film 180 can be increased.

The conductive films 143 and 153 have a function of protecting the conductive films 142 and 152 at the time of forming the insulating film 180. Therefore, the transistor 103 can have higher heat resistance and can be formed at a higher temperature than the transistor 101.

Figure 20A:
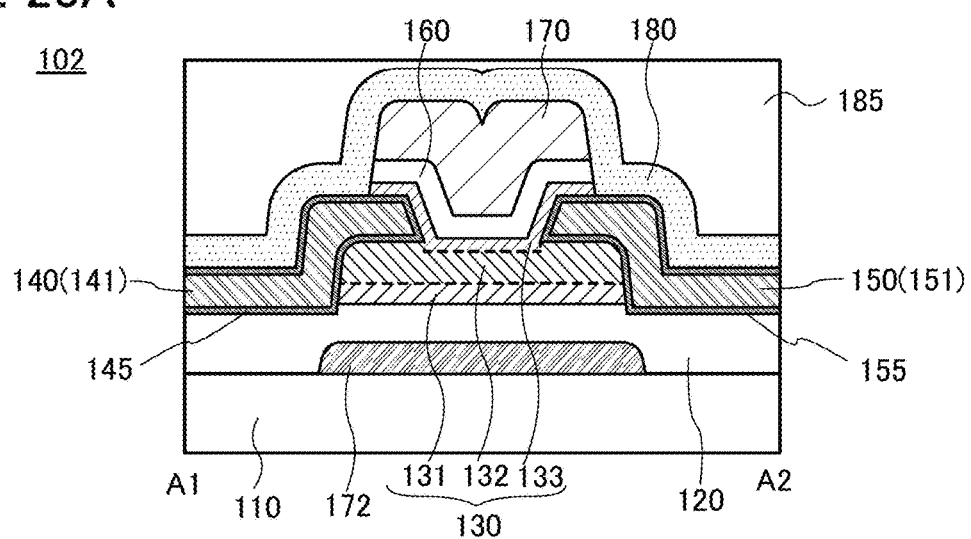
FIGS. 20A and 20B each illustrate a cross section of a transistor.

FIG. 20A is a cross-sectional view of the transistor 102 in FIG. 8A which has been subjected to heat treatment. FIG. 20A is different from FIG. 8A in that the oxide film 145 surrounds the source electrode 140 and the oxide film 155 surrounds the drain electrode 150. The oxide film 145 is formed on the top surface, the bottom surface, and the side surface of the source electrode 140, and the oxide film 155 is formed on the top surface, the bottom surface, and the side surface of the drain electrode 150.

Figure 20B:
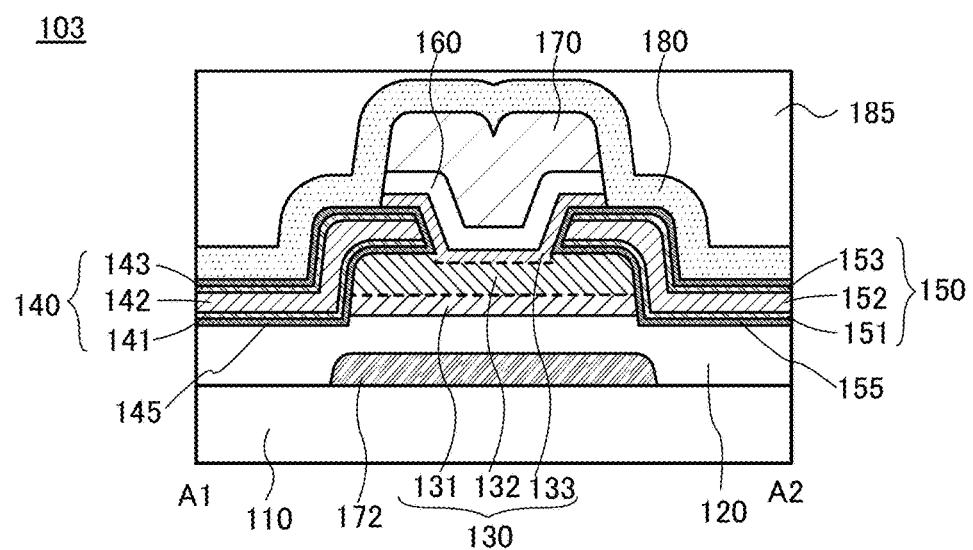

FIG. 20B is a cross-sectional view of the transistor 103 in FIG. 8B which has been subjected to heat treatment. FIG. 20B is different from FIG. 8B in that the oxide film 145 surrounds the source electrode 140 and the oxide film 155 surrounds the drain electrode 150. The oxide film 145 is formed on the top surface, the bottom surface, and the side surface of the source electrode 140, and the oxide film 155 is formed on the top surface, the bottom surface, and the side surface of the drain electrode 150.

Note that the description of the oxide films 145 and 155 in Embodiment 1 can be referred to for the details of the oxide films 145 and 155.

By the oxide films 145 and 155, Cu contained in the source electrode 140 and the drain electrode 150 can be prevented from diffusing to the outside of the electrodes and adversely affecting the oxide semiconductor 130. When the source electrode 140 and the drain electrode 150 have the above structure, a highly reliable semiconductor device with high conductivity can be provided.

In the transistor described in this embodiment, the conductive film 172 is used as a second gate electrode (back gate); however, the conductive film 172 may be omitted if not needed for operating the transistor.

Note that this embodiment can be combined with other embodiments and an example in this specification as appropriate.

Embodiment 3

In this embodiment, a transistor 301, a transistor 302, and a transistor 303 of one embodiment of the present invention are described with reference to FIGS. 9A to 9C.

Figure 9A:
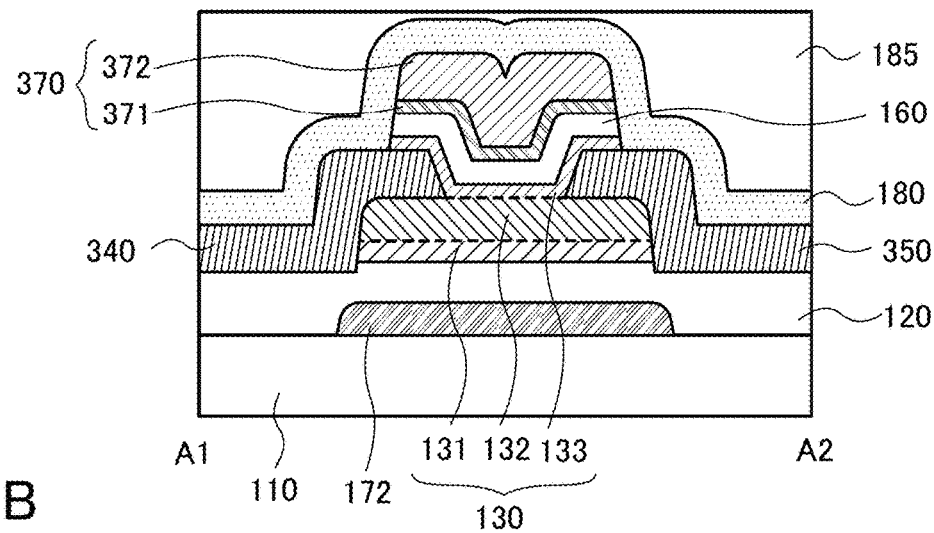
FIGS. 9A to 9C each illustrate a cross section of a transistor.
Figure 9B:
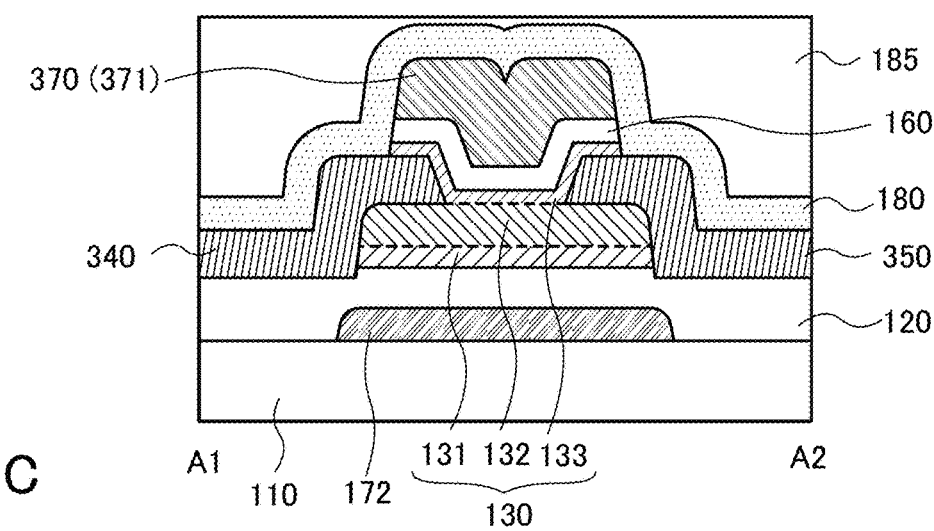
Figure 9C:
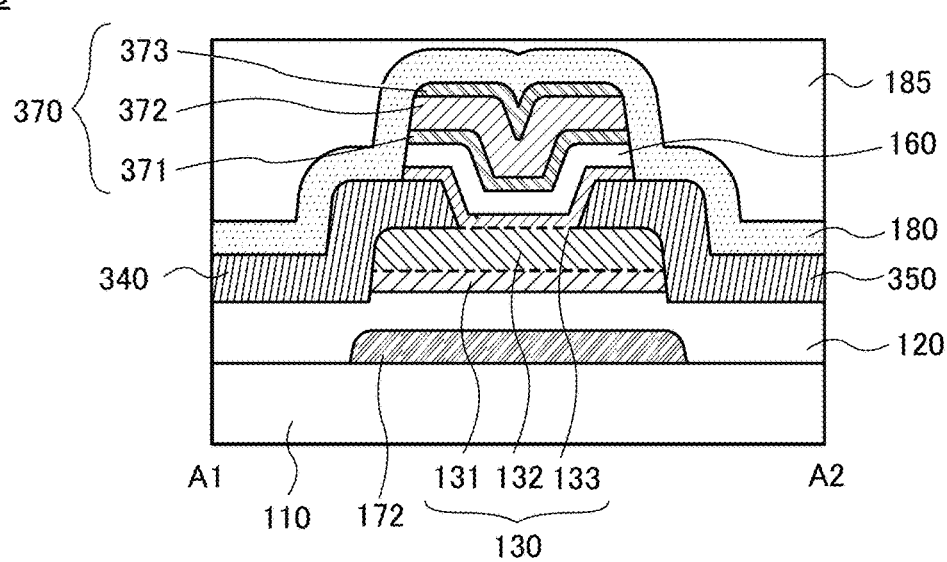

FIGS. 9A, 9B, and 9C are cross-sectional views in the channel length direction of the transistors 301, 302, and 303 of one embodiment of the present invention, respectively. The transistors 301, 302, and 303 each have a structure of the transistor 101 described in Embodiment 1 in which the source electrode 140 is replaced with a source electrode 340, the drain electrode 150 is replaced with a drain electrode 350, and the gate electrode 170 is replaced with a gate electrode 370 including a Cu—X alloy film. The other structures of the transistors 301, 302, and 303 are the same as those of the transistor 101.

A conductive film containing aluminum, titanium, chromium, nickel, molybdenum, tantalum, tungsten, ruthenium, or the like may be used for the source electrode 340 and the drain electrode 350. Note that plural kinds of conductive films may be stacked.

In the transistor 301 in FIG. 9A, the gate electrode 370 has a structure in which a conductive film 371 and a conductive film 372 are stacked in this order from the bottom.

A Cu—X alloy film is preferably used as the conductive film 371 in the transistor 301. The use of a Cu—X alloy film as the conductive film 371 can increase adhesion between the gate electrode 370 and the gate insulating film 160. In the case where the gate insulating film 160 is an oxide film, a Cu—X alloy film is used as the conductive film 371 and heat treatment is performed, whereby X in the Cu—X alloy film might form an oxide film of X at the interface with the gate insulating film 160. The oxide film can inhibit Cu in the Cu—X alloy film from entering the gate insulating film 160 and further, from entering the oxide semiconductor 130. The entry of Cu into the oxide semiconductor 130 is inhibited, whereby a highly reliable semiconductor device can be provided. As the conductive film 372, a conductive film containing a low-resistance material such as copper (Cu), aluminum (Al), gold (Au), or silver (Ag), an alloy containing any of these materials, or a compound containing any of these materials as a main component is preferably used. To improve the conductivity of the gate electrode 370, it is preferable that the thickness of the conductive film 372 be larger than that of the conductive film 371.

The heat treatment may be performed at a temperature higher than or equal to 100° C. and lower than or equal to 1000° C., preferably higher than or equal to 250° C. and lower than or equal to 650° C., and further preferably higher than or equal to 300° C. and lower than or equal to 500° C. The heat treatment may be performed using heat which is applied to the substrate at the time of a deposition process (including a step for depositing the Cu—X alloy film and a deposition step performed after the step).

The gate electrode 370 also functions as a wiring or the like. Therefore, when the gate electrode 370 includes a Cu—X alloy film and a low-resistance material such as copper, aluminum, gold, or silver, a semiconductor device in which wiring delay is reduced and which is capable of high-speed operation can be manufactured.

The transistor 302 in FIG. 9B has a structure of the transistor 301 in which the gate electrode 370 is formed of only a single layer of the conductive film 371.

Since the gate electrode 370 has only a single layer, the manufacturing process of the transistor 302 is more simple than that of the transistor 301.

In a manner similar to that in the transistor 301, a Cu—X alloy film is preferably used as the conductive film 371 in the transistor 302.

The transistor 303 in FIG. 9C has a structure of the transistor 301 in which the gate electrode 370 is formed of the conductive film 371, the conductive film 372, and a conductive film 373 which are stacked in this order from the bottom.

In a manner similar to that in the transistor 301, it is preferable that a Cu—X alloy film be used as the conductive film 371 in the transistor 303. For the conductive film 372 of the transistor 303, a conductive film containing a low-resistance material such as copper (Cu), aluminum (Al), gold (Au), or silver (Ag), an alloy containing any of these materials, or a compound containing any of these materials as a main component is preferably used.

A Cu—X alloy film is preferably used as the conductive film 373. When a Cu—X alloy film is used as the conductive film 373, adhesion between the gate electrode 370 and the insulating film 180 can be increased.

The conductive film 373 has a function of protecting the conductive film 372 at the time of forming the insulating film 180. Therefore, the transistor 303 can have higher heat resistance and can be formed at a higher temperature than the transistor 301.

Figure 21A:
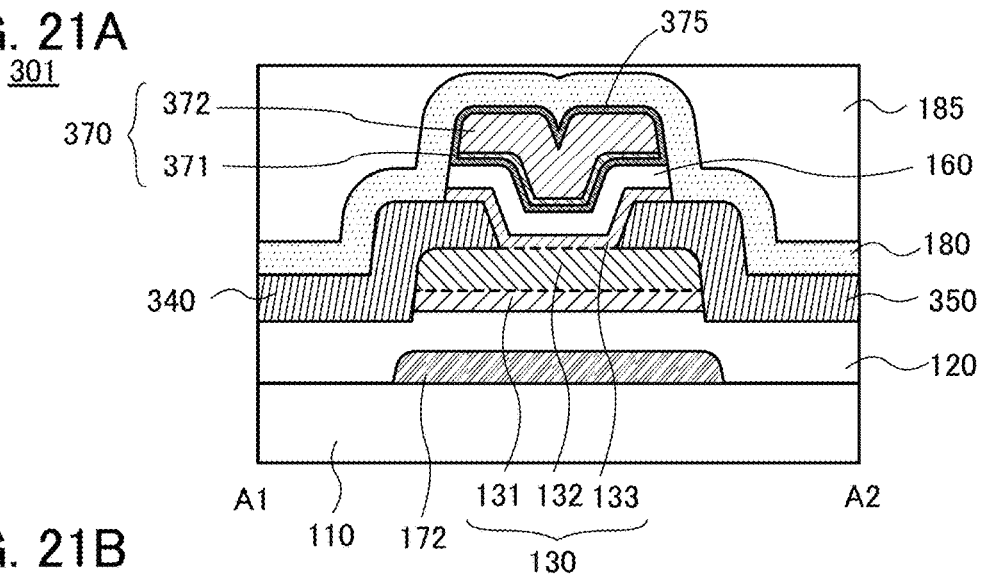
FIGS. 21A to 21C each illustrate a cross section of a transistor.

FIG. 21A is a cross-sectional view of the transistor 301 in FIG. 9A in the case where the gate electrode 370 is subjected to heat treatment. FIG. 21A is different from FIG. 9A in that an oxide film 375 surrounds the gate electrode 370. The oxide film 375 is formed on the top surface, the bottom surface, and the side surface of the gate electrode 370.

Figure 21B:
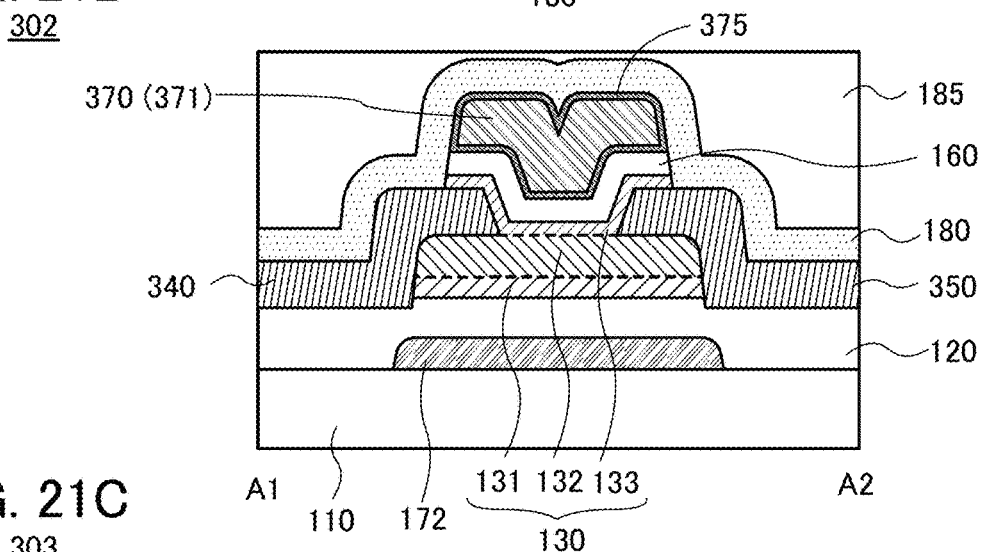

FIG. 21B is a cross-sectional view of the transistor 302 in FIG. 9B in the case where the gate electrode 370 is subjected to heat treatment. FIG. 21B is different from FIG. 9B in that the oxide film 375 surrounds the gate electrode 370. The oxide film 375 is formed on the top surface, the bottom surface, and the side surface of the gate electrode 370.

Figure 21C:
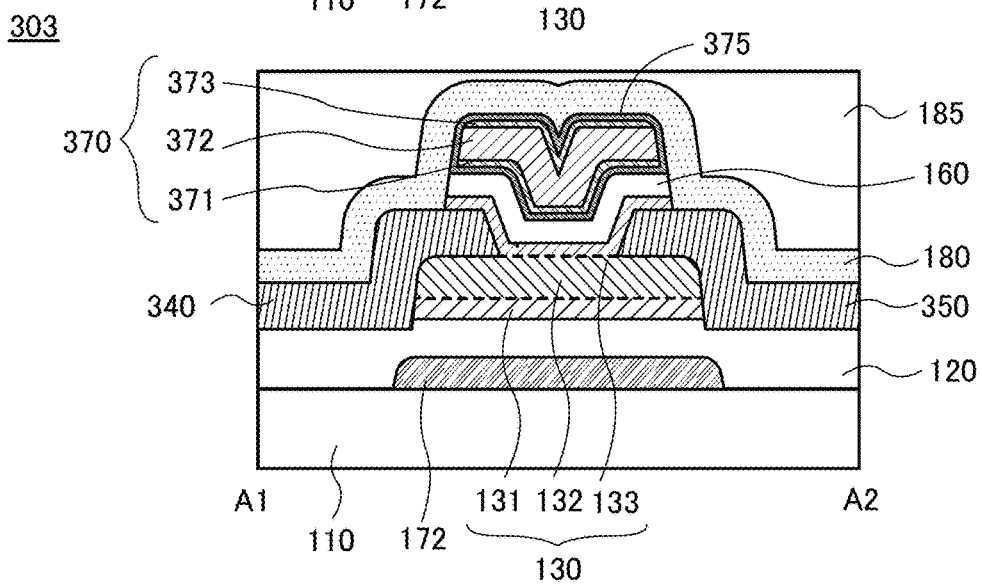

FIG. 21C is a cross-sectional view of the transistor 303 in FIG. 9C in the case where the gate electrode 370 is subjected to heat treatment. FIG. 21C is different from FIG. 9C in that the oxide film 375 surrounds the gate electrode 370. The oxide film 375 is formed on the top surface, the bottom surface, and the side surface of the gate electrode 370.

Note that the description of the oxide films 145 and 155 in Embodiment 1 can be referred to for the details of the oxide film 375.

By the oxide film 375, Cu contained in the gate electrode 370 can be prevented from diffusing to the outside of the electrode and adversely affecting the oxide semiconductor 130. When the gate electrode 370 has the above structure, a highly reliable semiconductor device with high conductivity can be provided.

In the transistor described in this embodiment, the conductive film 172 is used as a second gate electrode (back gate); however, the conductive film 172 may be omitted if not needed for operating the transistor.

Note that this embodiment can be combined with other embodiments and an example in this specification as appropriate.

Embodiment 4

In this embodiment, a transistor 401, a transistor 402, and a transistor 403 of one embodiment of the present invention are described with reference to FIGS. 10A to 10C.

Figure 10A:
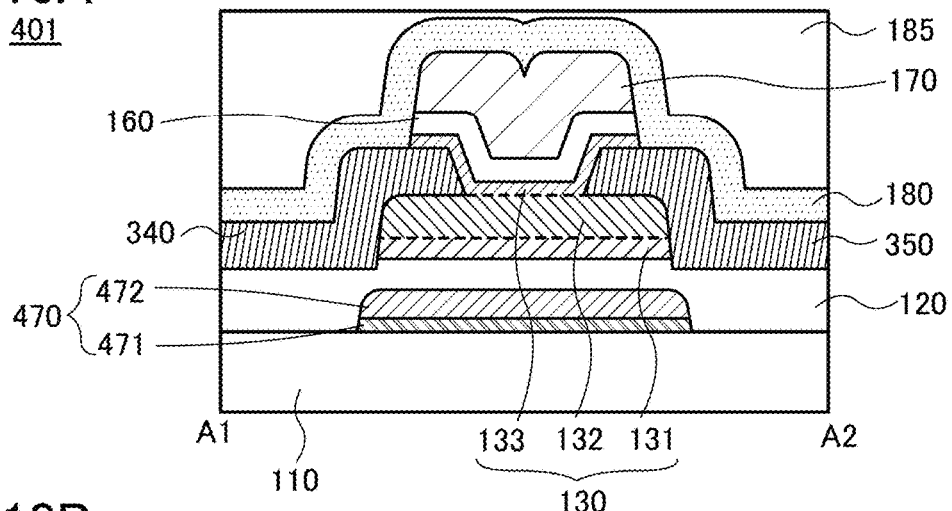
FIGS. 10A to 10C each illustrate a cross section of a transistor.
Figure 10B:
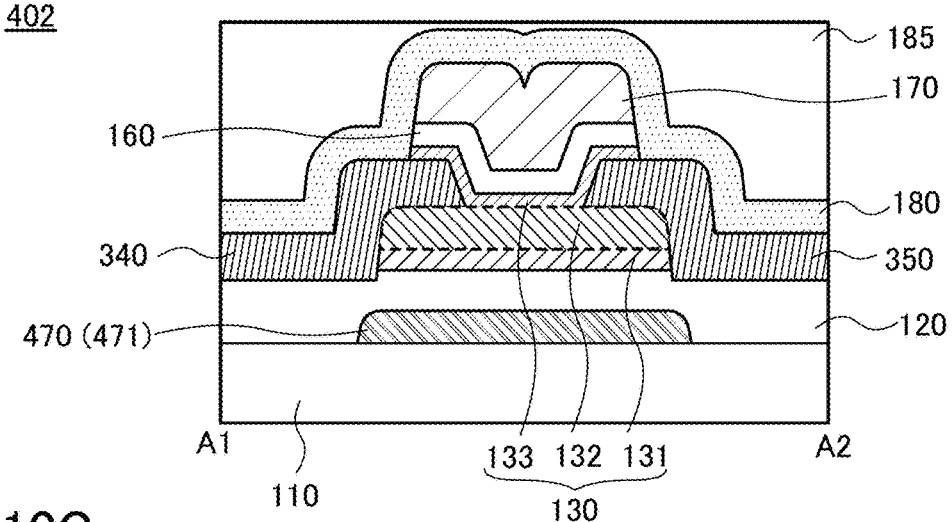
Figure 10C:
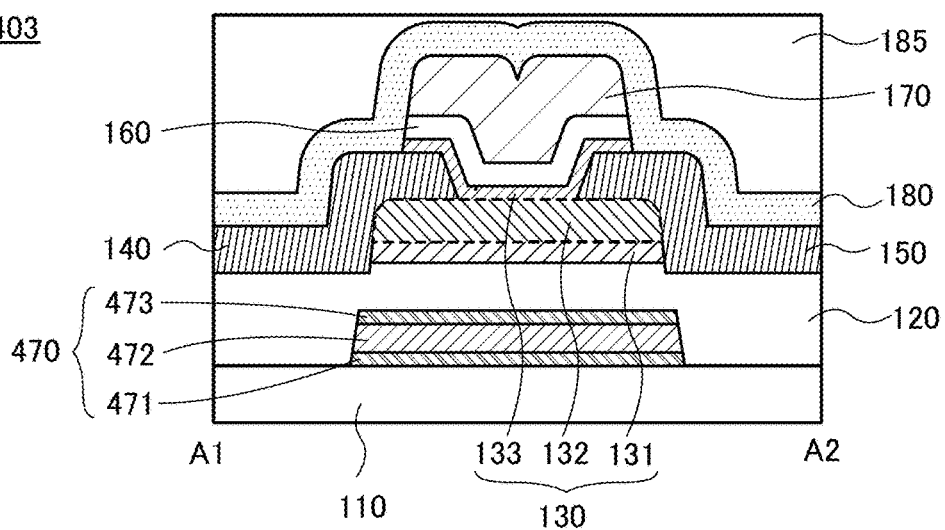

The transistors 401, 402, and 403 in FIGS. 10A to 10C each have a structure of the transistor 301 described in Embodiment 3 in which the gate electrode 370 is replaced with the gate electrode 170 described in Embodiment 1, and the conductive film 172 used as a second gate electrode is replaced with a conductive film 470 including a Cu—X alloy film.

In the transistor 401 in FIG. 10A, the conductive film 470 has a structure in which a conductive film 471 and a conductive film 472 are stacked in this order from the bottom.

In the transistor 401, a Cu—X alloy film is preferably used as the conductive film 471 in contact with the substrate 110. The use of a Cu—X alloy film as the conductive film 471 improves adhesion with the substrate 110. Furthermore, in the case where the surface of the substrate 110 includes oxide, when heat treatment is performed, X in the Cu—X alloy film might form an oxide film of X at the interface with the substrate 110. The oxide film can inhibit Cu in the Cu—X alloy film from entering the substrate 110. In the case where a semiconductor element is formed over the substrate 110, Cu that has entered the substrate 110 might degrade the electrical characteristics of the semiconductor element; therefore, it is important to inhibit Cu from entering the substrate 110. As the conductive film 472, a conductive film containing a low-resistance material such as copper (Cu), aluminum (Al), gold (Au), or silver (Ag), an alloy containing any of these materials, or a compound containing any of these materials as a main component is preferably used. To improve the conductivity of the conductive film 470, it is preferable that the thickness of the conductive film 472 be larger than that of the conductive film 471.

The heat treatment may be performed at a temperature higher than or equal to 100° C. and lower than or equal to 1000° C., preferably higher than or equal to 250° C. and lower than or equal to 650° C., and further preferably higher than or equal to 300° C. and lower than or equal to 500° C. The heat treatment may be performed using heat which is applied to the substrate at the time of a deposition process (including a step for depositing the Cu—X alloy film and a deposition step performed after the step).

The conductive film 470 also functions as a wiring or the like. Therefore, when the conductive film 470 includes a Cu—X alloy and a low-resistance material such as copper, aluminum, gold, or silver, a semiconductor device in which wiring delay is reduced and which is capable of high-speed operation can be manufactured.

In the transistor 402 in FIG. 10B, the conductive film 470 is formed of only a single layer of the conductive film 471.

Since the transistor 402 is formed of only the single layer of the conductive film 470, the manufacturing process of the transistor 402 is more simple than that of the transistor 401.

In the transistor 403 in FIG. 10C, the conductive film 470 has a structure in which the conductive film 471, the conductive film 472, and a conductive film 473 are stacked in this order from the bottom.

In a manner similar to that in the transistor 401, it is preferable that a Cu—X alloy film be used as the conductive film 471 in the transistor 403. For the conductive film 472 of the transistor 402, a conductive film containing a low-resistance material such as copper (Cu), aluminum (Al), gold (Au), or silver (Ag), an alloy containing any of these materials, or a compound containing any of these materials as a main component is preferably used.

A Cu—X alloy film is preferably used as the conductive film 473. When a Cu—X alloy film is used as the conductive film 473, adhesion between the conductive film 470 and the insulating film 120 can be increased.

The conductive film 473 has a function of protecting the conductive film 472 at the time of forming the insulating film 120. Therefore, the transistor 403 can have higher heat resistance and can be formed at a higher temperature than the transistor 401.

In the transistor described in this embodiment, as in the transistors 301, 302, and 303 in FIGS. 21A to 21C, an oxide film can be formed on the bottom surface, the top surface, and/or the side surface of the conductive film 470 in such a manner that heat is applied to the conductive film 470. For example, in the case where the conductive film 471 or the conductive film 473 includes a Cu—Mn alloy film, heat is applied to the conductive film 470, whereby an oxide film containing manganese oxide can be formed on the bottom surface, the top surface, and/or the side surface of the conductive film 470. The oxide film has a function of inhibiting Cu contained in the conductive film 470 from diffusing to the outside of the conductive film 470 and adversely affecting the oxide semiconductor 130.

Note that this embodiment can be combined with other embodiments and an example in this specification as appropriate.

Embodiment 5

In this embodiment, a transistor 501 and a transistor 601 of one embodiment of the present invention are described with reference to FIGS. 11A to 11C and FIGS. 12A to 12C.

Figure 11A:
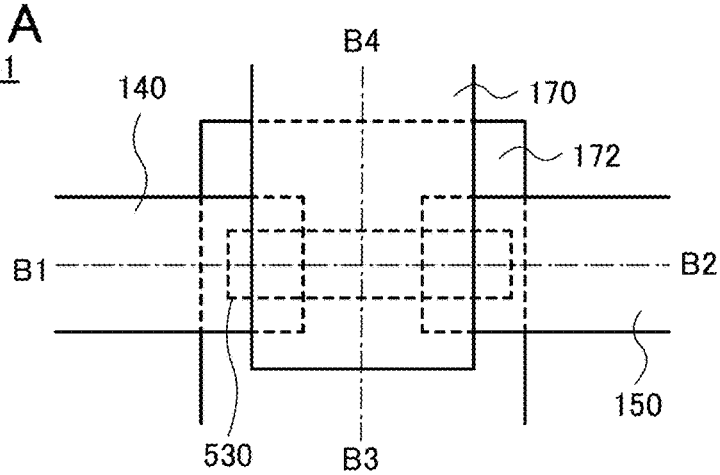
FIGS. 11A to 11C are a top view and cross-sectional views of a transistor.
Figure 11B:
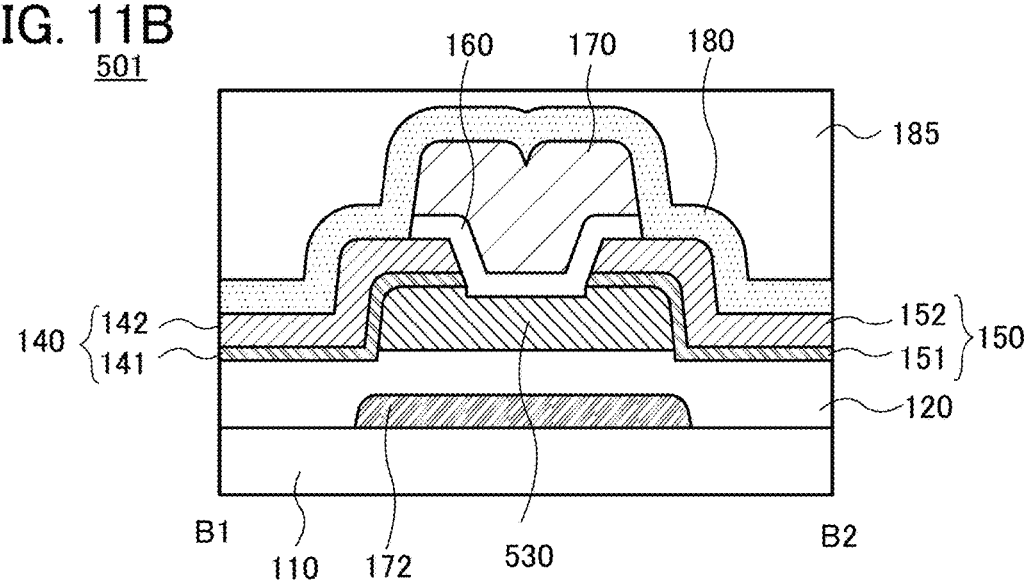
Figure 11C:
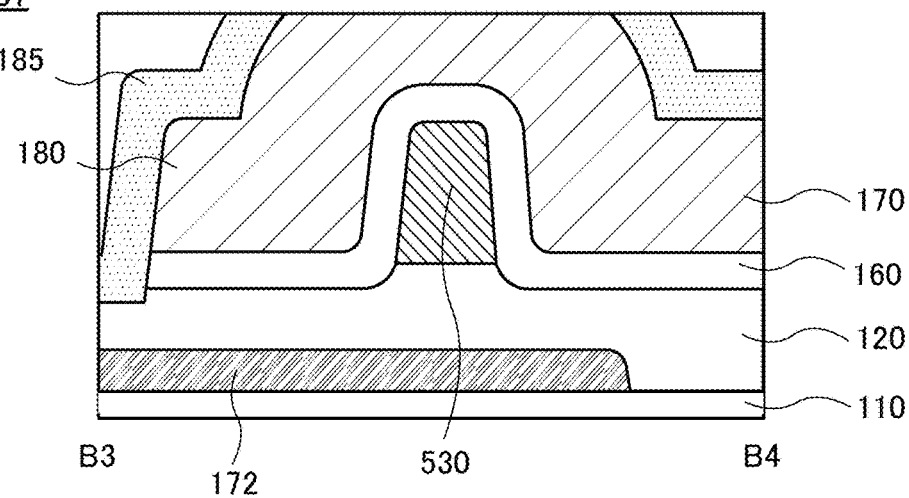

FIGS. 11A, to 11C are a top view and cross-sectional views of a transistor 501 of one embodiment of the present invention. FIG. 11A is a top view, and FIG. 11B illustrates a cross section taken along a dashed-dotted line B1-B2 in FIG. 11A. FIG. 11C illustrates a cross section taken along a dashed-dotted line B3-B4 in FIG. 11A. In FIGS. 11A to 11C, some components are enlarged, reduced in size, or omitted for easy understanding. In some cases, the direction of the dashed-dotted line B1-B2 is referred to as a channel length direction, and the direction of the dashed-dotted line B3-B4 is referred to as a channel width direction.

The transistor 501 in FIGS. 11A to 11C has a structure of the transistor 101 described in Embodiment 1 in which the oxide semiconductor 130 formed of stacked three layers is replaced with an oxide semiconductor 530 formed of a single layer of an oxide semiconductor. In the transistor 501, the gate insulating film 160 is in contact with the source electrode 140 and the drain electrode 150. The other structures of the transistor 501 are the same as those of the transistor 101.

Note that the description of the oxide semiconductor 132 in Embodiment 1 can be referred to for the detail of the oxide semiconductor 530.

Since the oxide semiconductor 530 includes the single layer of an oxide semiconductor, the manufacturing process of the transistor 501 is more simple than that of the transistor 101.

Note that this embodiment can be combined with other embodiments and an example in this specification as appropriate.

Figure 12A:
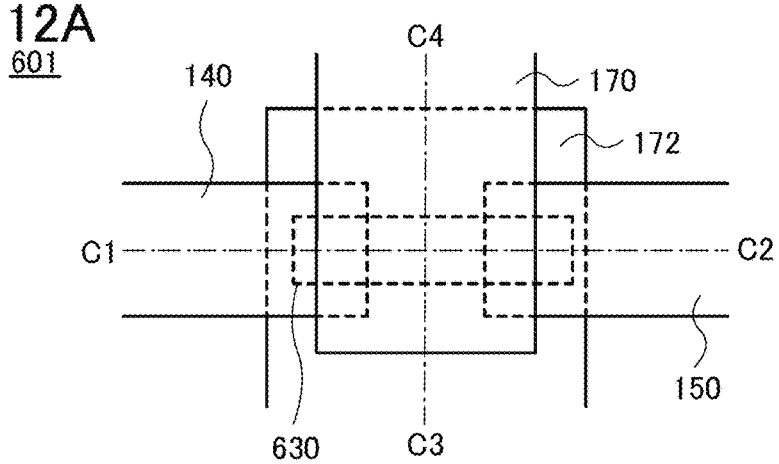
FIGS. 12A to 12C are a top view and cross-sectional views of a transistor.
Figure 12B:
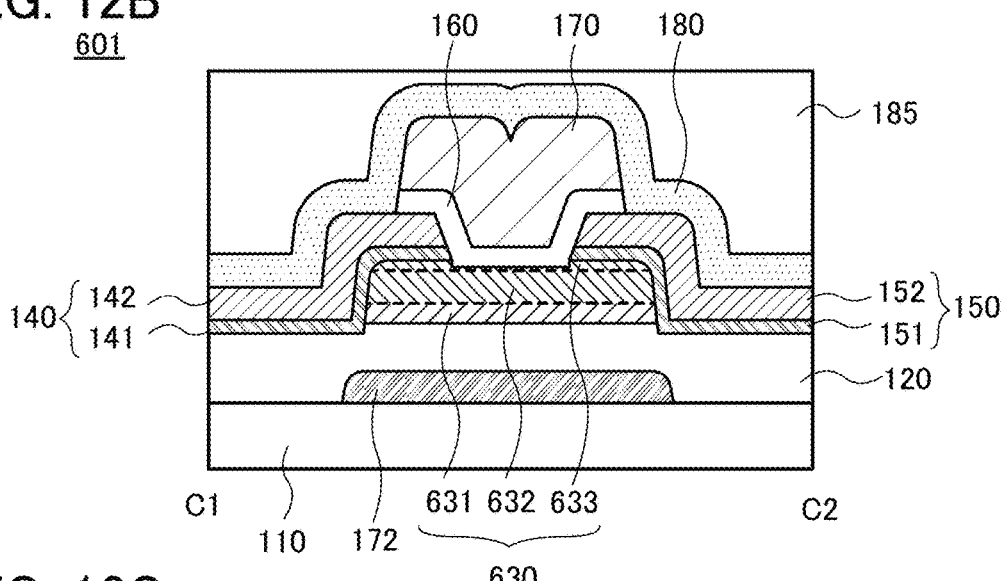
Figure 12C:
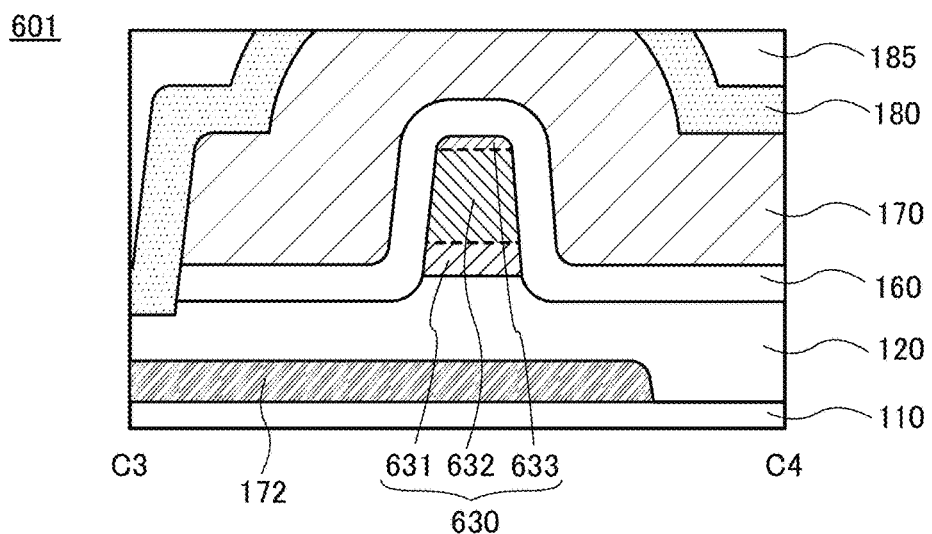

FIGS. 12A to 12C are a top view and cross-sectional views of a transistor 601 of one embodiment of the present invention. FIG. 12A is the top view, and FIG. 12B illustrates a cross section taken along a dashed-dotted line C1-C2 in FIG. 12A. FIG. 12C illustrates a cross section taken along a dashed-dotted line C3-C4 in FIG. 12A. In FIGS. 12A to 12C, some components are enlarged, reduced in size, or omitted for easy understanding. In some cases, the direction of the dashed-dotted line C1-C2 is referred to as a channel length direction, and the direction of the dashed-dotted line C3-C4 is referred to as a channel width direction.

The transistor 601 in FIGS. 12A to 12C has a structure of the transistor 101 described in Embodiment 1 in which the oxide semiconductor 130 is replaced with an oxide semiconductor 630. The oxide semiconductor 630 is formed of an oxide semiconductor 631, an oxide semiconductor 632, and an oxide semiconductor 633 which are stacked in this order. The transistor 601 is the same as the transistor 101 in that the oxide semiconductor is formed of three layers. As for a different point, in the transistor 101, the oxide semiconductor 133 is provided over the source electrode 140 and the drain electrode 150, whereas in the transistor 601, the oxide semiconductor 633 is provided below the source electrode 140 and the drain electrode 150. The other structures of the transistor 601 is the same as those of the transistor 101.

The descriptions of the oxide semiconductor 131, the oxide semiconductor 132, and the oxide semiconductor 133 described in Embodiment 1 may be referred to for details of the oxide semiconductor 631, the oxide semiconductor 632, and the oxide semiconductor 633, respectively.

The oxide semiconductors 631, 632, and 633 in the transistor 601 can be deposited successively in an air atmosphere in the same deposition apparatus without exposure to the air during the process; therefore, the oxide semiconductors 631, 632, and 633 can be oxide semiconductors that have a smaller amount of impurities (hydrogen, nitrogen, carbon, silicon, metal elements other than main components, and the like) than those in the transistor 101.

Although the conductive film 172 is used as a second gate electrode (back gate) in the transistor described in this embodiment, the conductive film 172 may be omitted if not needed for operating the transistor.

Note that this embodiment can be combined with other embodiments and an example in this specification as appropriate.

Embodiment 6

In this embodiment, an example of a semiconductor device including a transistor of one embodiment of the present invention is described with reference to FIGS. 13A to 13D.

[Cross-Sectional Structure]

FIG. 13A is a cross-sectional view of a semiconductor device of one embodiment of the present invention. The semiconductor device in FIG. 13A includes a substrate 2001, an element isolation layer 2002, a transistor 2200, a transistor 2100, a plurality of plugs 2003, a plurality of wirings 2004, a wiring 2005, a wiring 2006, and an insulating film 2007. The transistor 2200 includes impurity regions 2201 functioning as a source and a drain, a gate insulating film 2202, a gate electrode 2203, and a sidewall insulating layer 2204. A cross-sectional view of the transistors in the channel length direction is on the left side of a dashed-dotted line, and a cross-sectional view of the transistors in the channel width direction is on the right side of the dashed-dotted line.

The wiring 2005 may be formed in the same process as a source electrode and a drain electrode of the transistor 2100.

The semiconductor device illustrated in FIG. 13A includes the transistor 2200 including a first semiconductor material in a lower portion and the transistor 2100 containing a second semiconductor material in an upper portion. FIG. 13A illustrates an example in which the transistor 101 described in Embodiment 1 is used as the transistor 2100.

Here, the first semiconductor material and the second semiconductor material are preferably materials having different band gaps. For example, the first semiconductor material can be a semiconductor material other than an oxide semiconductor (examples of such a semiconductor material include silicon, germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 2200 may be either an n-channel transistor or a p-channel transistor, and an appropriate transistor may be used in accordance with a circuit.

Moreover, the transistor 2200 may include an impurity region functioning as a lightly doped drain (LDD) region or an extension region under the sidewall insulating layer 2204. In particular, when the transistor 2200 is an n-channel transistor, the LDD region or the extension region are preferably provided in order to suppress the deterioration due to hot carriers.

As the transistor 2200, a transistor containing silicide (salicide) or a transistor which does not include the sidewall insulating layer 2204 may be used. When a structure that contains silicide (salicide) is used, resistance of the source region and the drain region can be further lowered and the speed of the semiconductor device is increased. Furthermore, the semiconductor device can be operated at low voltage; thus, power consumption of the semiconductor device can be reduced.

By stacking two transistors in the above manner, an area occupied by a circuit can be reduced; accordingly, a plurality of circuits can be arranged in high density.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2007 having a function of preventing diffusion of hydrogen is provided between the transistors 2100 and 2200. The insulating film 2007 makes hydrogen remain in the lower portion, thereby improving the reliability of the transistor 2200. In addition, since the insulating film 2007 suppresses diffusion of hydrogen from the lower portion to the upper portion, the reliability of the transistor 2100 also can be improved.

The insulating film 2007 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that the transistor 2200 can be a transistor of various types without being limited to a planar type transistor. For example, the transistor 2200 can be a fin-type transistor, a tri-gate transistor, or the like. An example of a cross-sectional view in this case is illustrated in FIG. 13D. An insulating film 2212 is provided over a semiconductor substrate 2211. The semiconductor substrate 2211 includes a projection portion with a thin tip (also referred to a fin). Note that an insulating film may be provided over the projection portion. The insulating film functions as a mask for preventing the semiconductor substrate 2211 from being etched when the projection portion is formed. Alternatively, the projection portion may not have the thin tip; a projection portion with a cuboid-like projection portion and a projection portion with a thick tip are permitted, for example. A gate insulating film 2214 is provided over the projection portion of the semiconductor substrate 2211, and a gate electrode 2213 and a sidewall insulating layer 2216 is provided over the gate insulating film 2214. In the semiconductor substrate 2211, impurity regions 2215 functioning as a source and a drain are formed. Note that here is shown an example in which the semiconductor substrate 2211 includes the projection portion; however, a semiconductor device of one embodiment of the present invention is not limited thereto. For example, a semiconductor region having a protruding portion may be formed by processing an SOI substrate.

In FIGS. 13A and 13D, regions where reference numerals and hatching patterns are not given show regions formed of an insulator. In these regions, an insulator containing one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

Figure 22A:
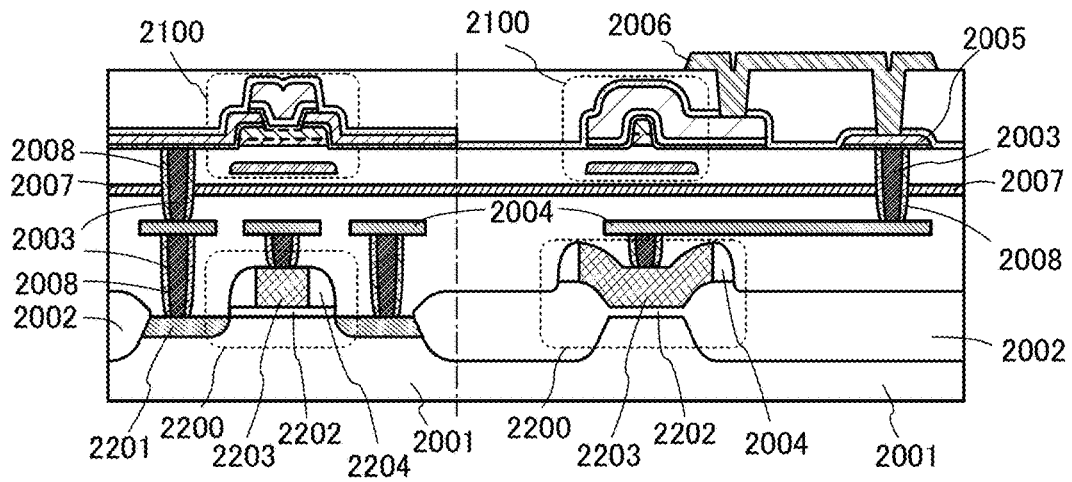
FIGS. 22A and 22B each illustrate a cross section of a semiconductor device.

FIG. 22A illustrates another example of the semiconductor device in FIG. 13A, in which a conductor including a Cu—X alloy is used for the plugs 2003, and oxide films 2008 are formed on the side surfaces of the plugs 2003.

The plugs 2003 are formed using a conductor including an Cu—X alloy and heat is applied thereto, whereby the oxide films 2008 are formed. In the case where the plugs 2003 are each in contact with oxide, X in the Cu—X alloy is segregated and reacts with oxygen, so that the oxide film 2008 of X is formed at the interface between the oxide and each of the plugs 2003. For example, when the plugs 2003 include a Cu—Mn alloy, the oxide films 2008 include a manganese oxide. The oxide films 2008 have a function of inhibiting Cu contained in the plugs 2003 from diffusing to the outside of the plugs 2003.

Figure 22B:
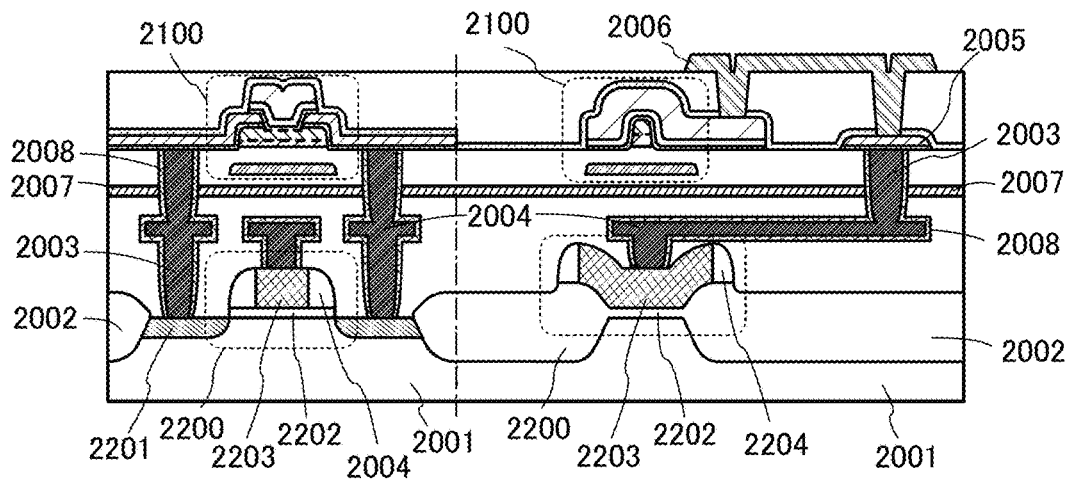

FIG. 22B illustrates an example in which the wirings 2004 in FIG. 22A are formed using a conductor including a Cu—X alloy film. As in the plugs 2003, the oxide films 2008 are formed on the top surfaces, the bottom surfaces, and the side surfaces of the wirings 2004 by application of heat. For example, when the wirings 2004 a Cu—Mn alloy, the oxide films 2008 include a manganese oxide. The oxide films 2008 have a function of inhibiting Cu contained in the wirings 2004 from diffusing to the outside of the wirings.

In FIGS. 22A and 22D, regions where reference numerals and hatching patterns are not given show regions formed of an insulator. In these regions, an insulator containing one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used. In particular, a region where the oxide film 2008 is formed is preferably in contact with the insulator containing oxygen.

When the plugs 2003 or the wirings 2004 have the above structure, diffusion of Cu that adversely affects the transistor 2200 or the transistor 2100 can be inhibited and a semiconductor device with reduced wiring delay can be provided.

Circuit Configuration Example

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Circuit]

A circuit diagram in FIG. 13B illustrates a configuration of what is called a CMOS circuit in which the p-channel transistor 2200 and the n-channel transistor 2100 are connected in series and in which gates of them are connected to each other.

[Analog Switch]

A circuit diagram in FIG. 13C illustrates a configuration in which sources of the transistors 2100 and 2200 are connected to each other and drains of the transistors 2100 and 2200 are connected to each other. With such a configuration, the transistors can function as a so-called analog switch.

[Example of Memory Device]

Figure 14A:
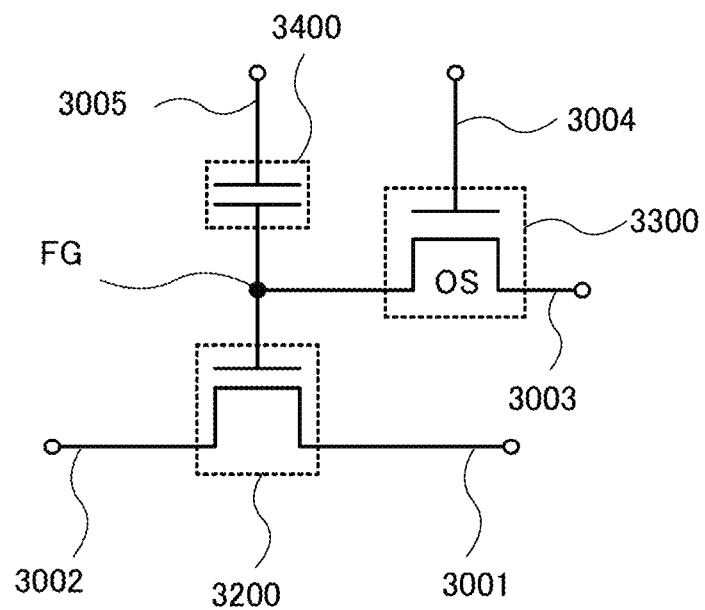
FIGS. 14A and 14B are circuit diagrams each illustrating an example of a memory device.
Figure 14B:
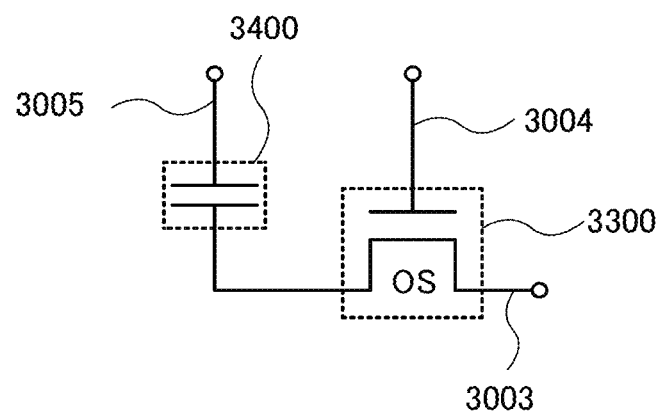

An example of a semiconductor device (memory device) which includes the transistor of one embodiment of the present invention, which can retain stored data even when not powered, and which has an unlimited number of write cycles is illustrated in FIGS. 14A and 14B.

The semiconductor device illustrated in FIG. 14A includes a transistor 3200 using a first semiconductor material, a transistor 3300 using a second semiconductor material, and a capacitor 3400. As the transistor 3300, the transistor of one embodiment of the present invention which is described in the above embodiment can be used.

The transistor 3300 is a transistor in which a channel is formed in a semiconductor layer including an oxide semiconductor. Since the off-state current of the transistor 3300 is low, stored data can be retained for a long period owing to such a transistor. In other words, power consumption can be sufficiently reduced because a semiconductor device in which refresh operation is unnecessary or the frequency of refresh operation is extremely low can be provided.

In FIG. 14A, a first wiring 3001 is electrically connected to a source electrode of the transistor 3200. A second wiring 3002 is electrically connected to a drain electrode of the transistor 3200. A third wiring 3003 is electrically connected to one of the source electrode and the drain electrode of the transistor 3300. A fourth wiring 3004 is electrically connected to the gate electrode of the transistor 3300. A gate electrode of the transistor 3200 is electrically connected to the other of the source electrode and the drain electrode of the transistor 3300 and a first terminal of the capacitor 3400. A fifth wiring 3005 is electrically connected to a second terminal of the capacitor 3400.

In the semiconductor device in FIG. 14A, the potential of the gate electrode of the transistor 3200 can be retained, whereby writing, retaining, and reading of data can be performed as follows.

Writing and holding of data is described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate of the transistor 3200 (writing). Here, charge for supplying either of two different potential levels (hereinafter referred to as low-level charge and high-level charge) is given. After that, the potential of the fourth wiring 3004 is set to a potential at which the transistor 3300 is turned off, so that the transistor 3300 is turned off. Thus, the charge supplied to the gate of the transistor 3200 is retained (retaining).

Since the off-state current of the transistor 3300 is extremely low, the charge of the gate of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor 3200. This is because in general, when the transistor 3200 is an n-channel transistor, an apparent threshold voltage Vth H in the case where a high-level charge is given to the gate electrode of the transistor 3200 is lower than an apparent threshold voltage Vth L in the case where a low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate electrode layer can be read by determining the potential of the second wiring 3002.

Note that in the case where memory cells are arrayed to be used, only data of desired memory cells needs to be read. The fifth wiring 3005 in the case where data is not read may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

The semiconductor device illustrated in FIG. 14B is different from the semiconductor device illustrated in FIG. 14A in that the transistor 3200 is not provided. Also in this case, writing and retaining operation of data can be performed in a manner similar to the semiconductor device illustrated in FIG. 14A.

Next, operation of data reading is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of a first terminal of the capacitor 3400 is $V_1$ and $V_0(V_1 > V_0)$, the potential of the third wiring 3003 in the case of retaining the potential $V_1(=(C_B \times V_{B0} + C \times V_1)(C_B + C))$ is higher than the potential of the third wiring 3003 in the case of retaining the potential $V_0(=(C_B \times V_{B0} + C \times V_0)(C_B + C))$.

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

Note that this embodiment can be combined with other embodiments and an example in this specification as appropriate.

Embodiment 7

In this embodiment, configuration examples of a display device using a transistor of one embodiment of the present invention are described.

Configuration Example

Figure 15A:
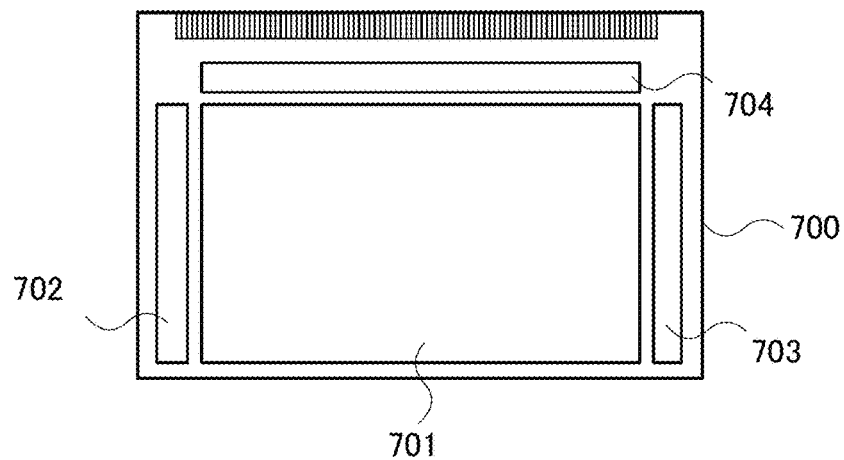
FIGS. 15A to 15C are a top view and circuit diagrams illustrating an example of a display device.
Figure 15B:
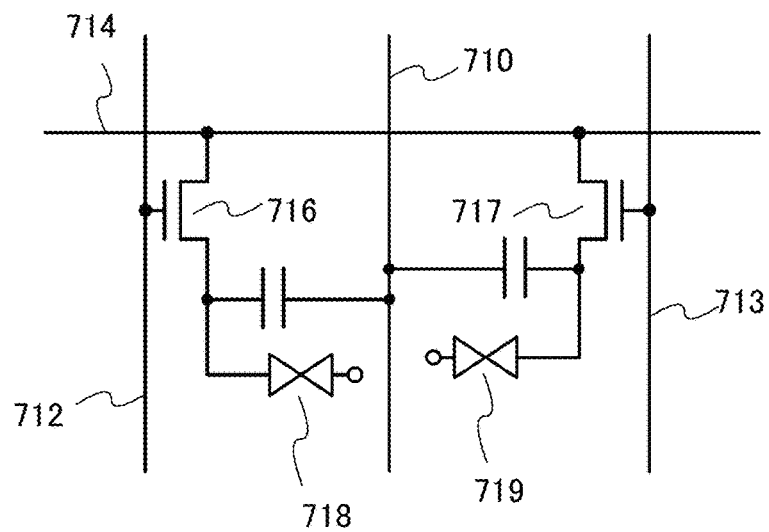
Figure 15C:
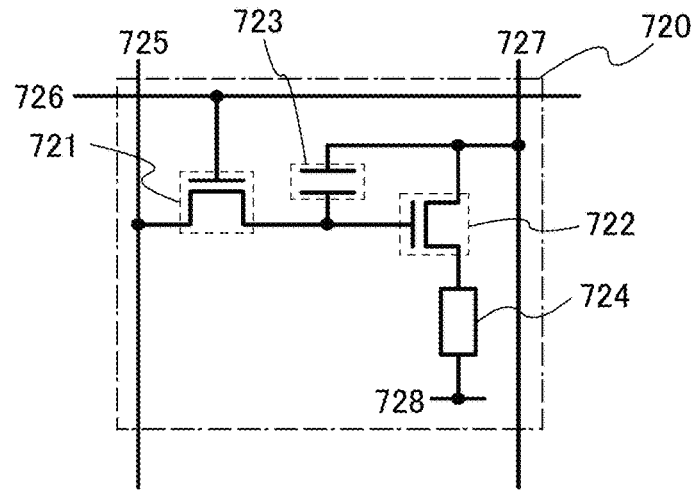

FIG. 15A is a top view of the display device of one embodiment of the present invention. FIG. 15B is a circuit diagram illustrating a pixel circuit that can be used in the case where a liquid crystal element is used in a pixel in the display device of one embodiment of the present invention. FIG. 15C is a circuit diagram illustrating a pixel circuit that can be used in the case where an organic EL element is used in a pixel in the display device of one embodiment of the present invention.

The transistor in the pixel portion can be formed in accordance with any of the above embodiments. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 15A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 15A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Display Device]

FIG. 15B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 15B. For example, a switch, a resistor, a capacitor, a transistor, a sensor, a logic circuit, or the like may be added to the pixel circuit illustrated in FIG. 15B.

[Organic EL Display Device]

FIG. 15C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 15C illustrates an applicable example of a pixel circuit. Here, one pixel includes two n-channel transistors. Note that the metal oxide film of one embodiment of the present invention can be used for a channel formation region of the n-channel transistor. Furthermore, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of other embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 15C. For example, a switch, a resistor, a capacitor, a sensor, a transistor, a logic circuit, or the like may be added to the pixel circuit illustrated in FIG. 15C.

In the case where the transistor shown in any of the above embodiments is used for the circuit shown in FIGS. 15A to 15C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or electrophoretic elements include electronic paper.

Note that this embodiment can be combined with other embodiments and an example in this specification as appropriate.

Embodiment 8

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic appliances that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 16A to 16F illustrate specific examples of these electronic appliances.

Figure 16A:
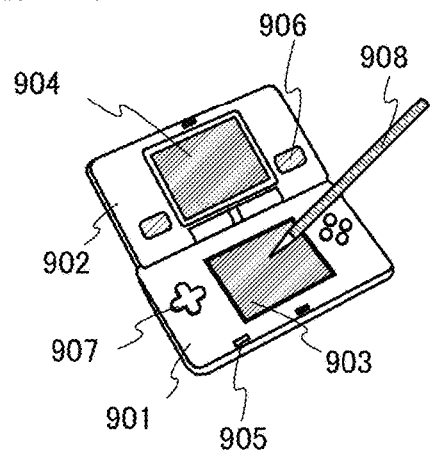
FIGS. 16A to 16F are external views illustrating examples of electronic appliances.

FIG. 16A illustrates a portable game console including a housing 901, a housing 902, a display portion 903, a display portion 904, a microphone 905, a speaker 906, an operation key 907, a stylus 908, and the like. Although the portable game machine in FIG. 16A has the two display portions 903 and 904, the number of display portions included in a portable game machine is not limited to this.

Figure 16B:
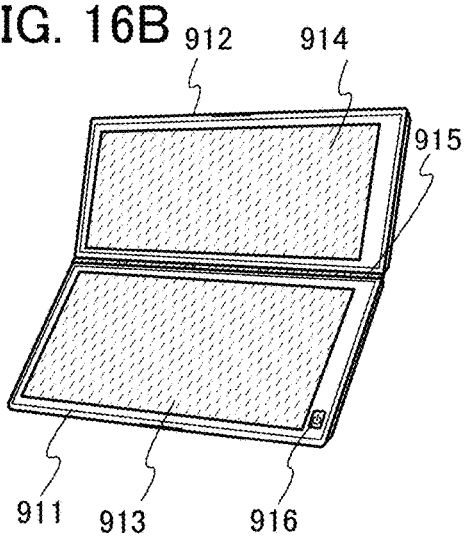

FIG. 16B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 16C:
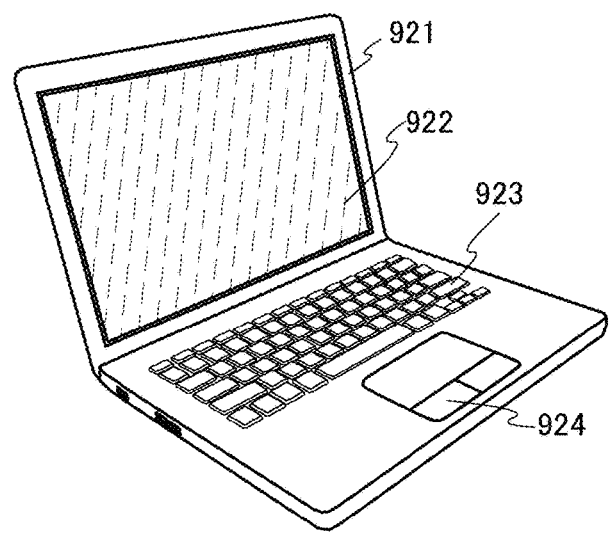

FIG. 16C illustrates a laptop personal computer, which includes a housing 921, a display portion 922, a keyboard 923, a pointing device 924, and the like.

Figure 16D:
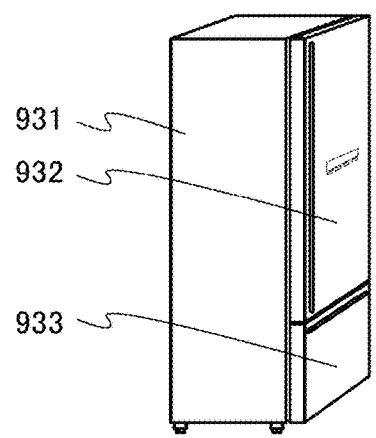

FIG. 16D illustrates an electric refrigerator-freezer including a housing 931, a door for a refrigerator 932, a door for a freezer 933, and the like.

Figure 16E:
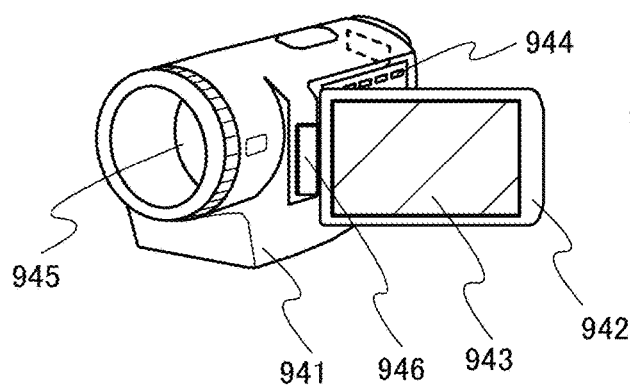

FIG. 16E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 16F:
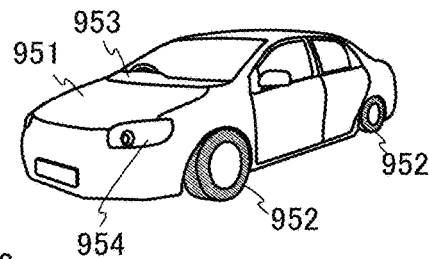
Figure 17A:
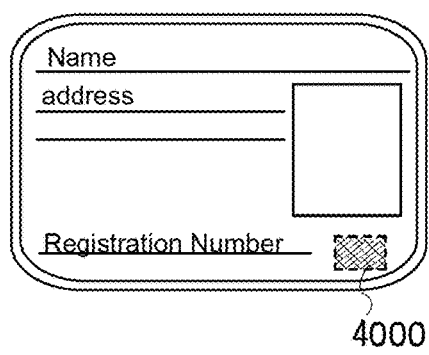
FIGS. 17A to 17F illustrate usage examples of an RF tag.
Figure 17B:
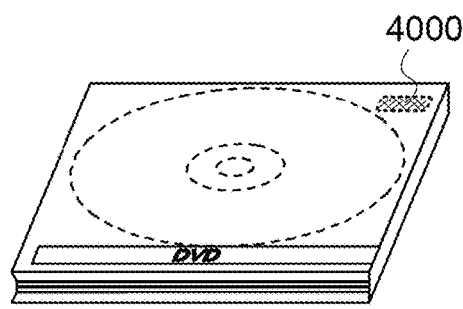
Figure 17C:
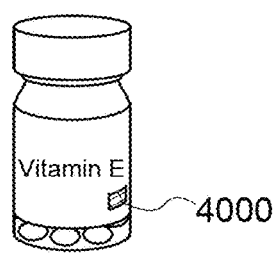
Figure 17D:
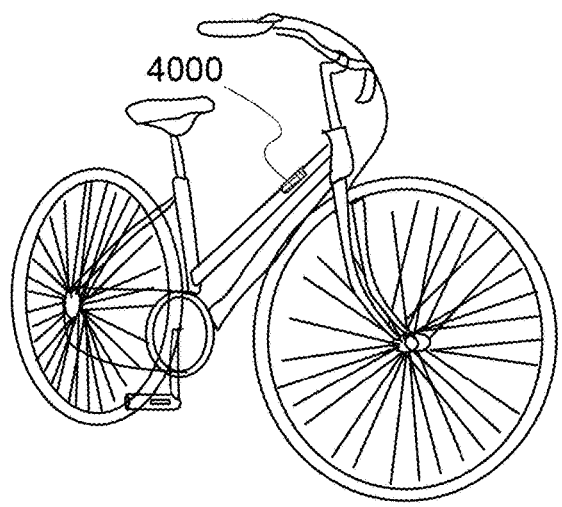
Figure 17E:
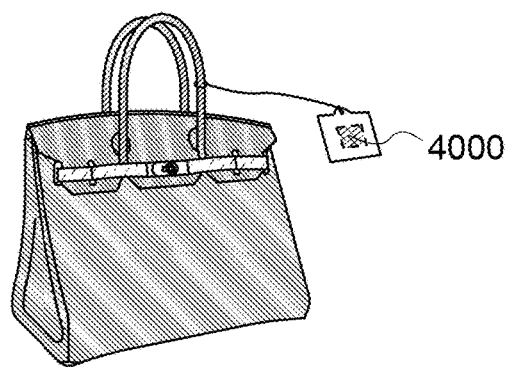
Figure 17F:
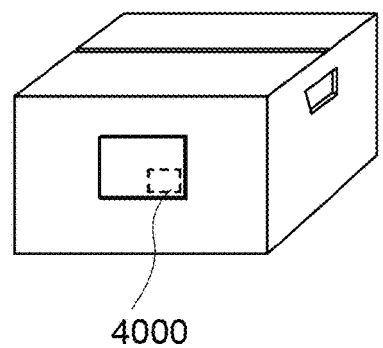

FIG. 16F illustrates an ordinary vehicle including a car body 951, wheels 952, a dashboard 953, lights 954, and the like.

Note that this embodiment can be combined with the other embodiments and an example in this specification as appropriate.

Embodiment 9

In this embodiment, application examples of an RF tag of one embodiment of the present invention are be described with reference to FIGS. 17A to 17F. The RF tag is widely used and can be provided for, for example, products such as bills, coins, securities, bearer bonds, documents (e.g., driver's licenses or resident's cards, see FIG. 17A), recording media (e.g., DVDs, video tapes, and memory sticks, see FIG. 17B), vehicles (e.g., bicycles, see FIG. 17D), packaging containers (e.g., wrapping paper or bottles, see FIG. 17C), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 17E and 17F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with other embodiments and an embodiment in this specification as appropriate.

Embodiment 10

In this embodiment, an oxide semiconductor film that can be used for a transistor of one embodiment of the present invention is described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 24A:
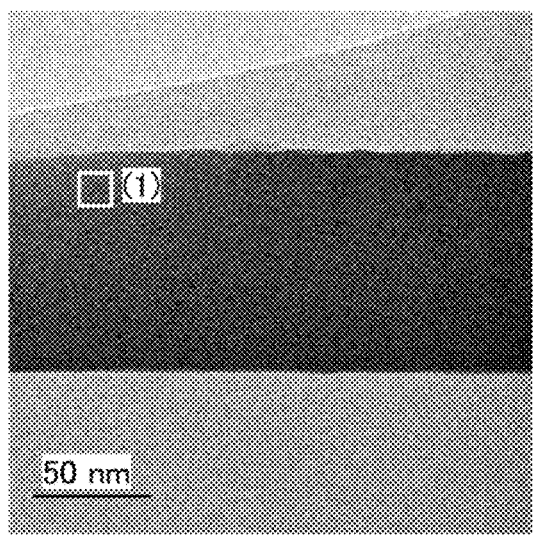
FIGS. 24A to 24D are Cs-corrected high-resolution TEM images of a cross section of a CAAC-OS and a cross-sectional schematic view of the CAAC-OS.

A CAAC-OS observed with TEM is described below. FIG. 24A shows an example of a high-resolution TEM image of a cross section of the CAAC-OS layer which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 24B:
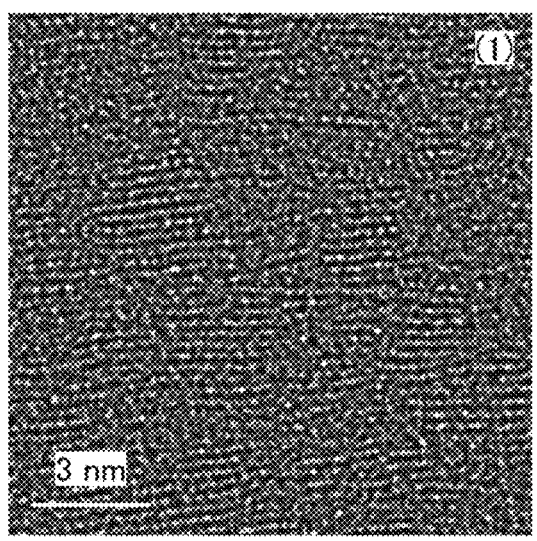

FIG. 24B is an enlarged Cs-corrected high-resolution TEM image of a region (1) in FIG. 24A. FIG. 24B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 24C:
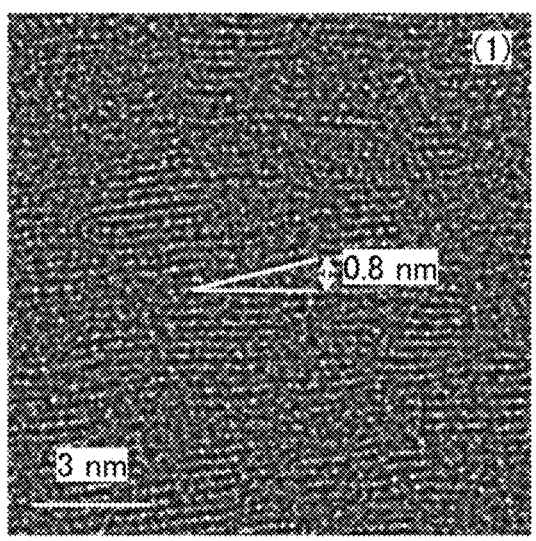

As shown in FIG. 24B, the CAAC-OS has a characteristic atomic arrangement. The characteristic atomic arrangement is denoted by an auxiliary line in FIG. 24C. FIGS. 24B and 24C prove that the size of a pellet is approximately 1 nm to 3 nm, and the size of a space caused by tilt of the pellets is approximately 0.8 nm. Therefore, the pellet can also be referred to as a nanocrystal (nc).

Figure 24D:
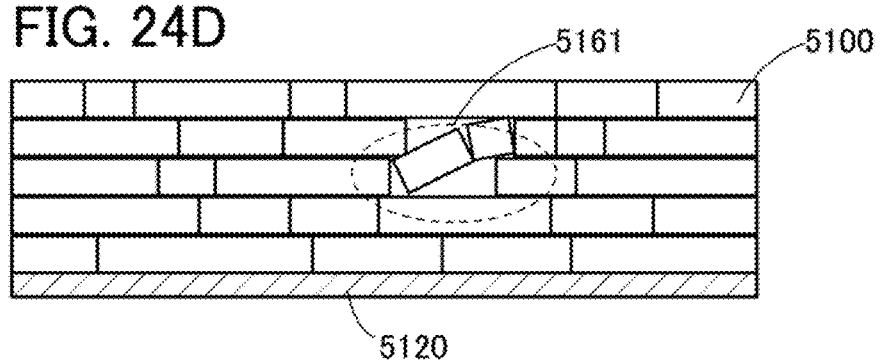

Here, according to the Cs-corrected high-resolution TEM images, the schematic arrangement of pellets 5100 of a CAAC-OS over a substrate 5120 is illustrated by such a structure in which bricks or blocks are stacked (see FIG. 24D). The portion in which the pellets are tilted as observed in FIG. 24C corresponds to a region 5161 shown in FIG. 24D.

FIG. 25A shows a Cs-corrected high-resolution TEM image of a plane of the CAAC-OS observed from a direction substantially perpendicular to the sample surface. FIGS. 25B, 25C, and 25D are enlarged Cs-corrected high-resolution TEM images of regions (1), (2), and (3) in FIG. 25A, respectively. FIGS. 25B, 25C, and 25D indicate that metal atoms are arranged in a triangular, quadrangular, or hexagonal configuration in a pellet. However, there is no regularity of arrangement of metal atoms between different pellets.

Figure 26A:
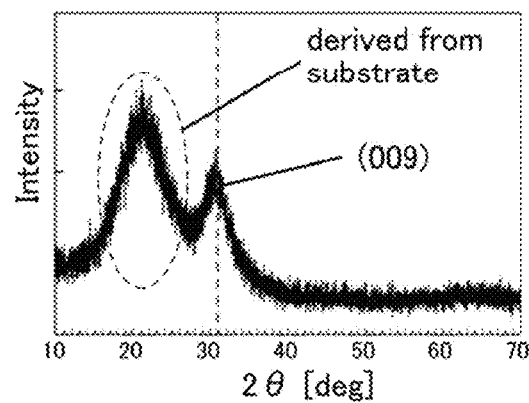
FIGS. 26A to 26C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 26A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 26B:
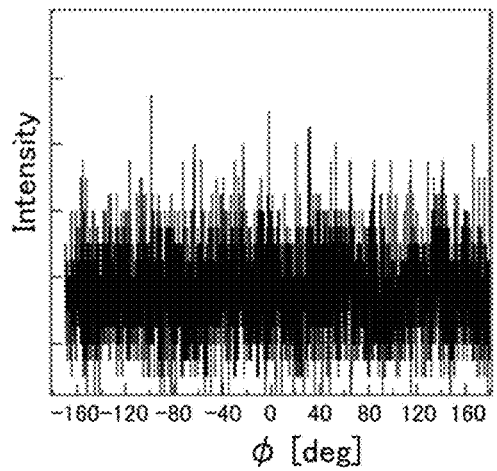
Figure 26C:
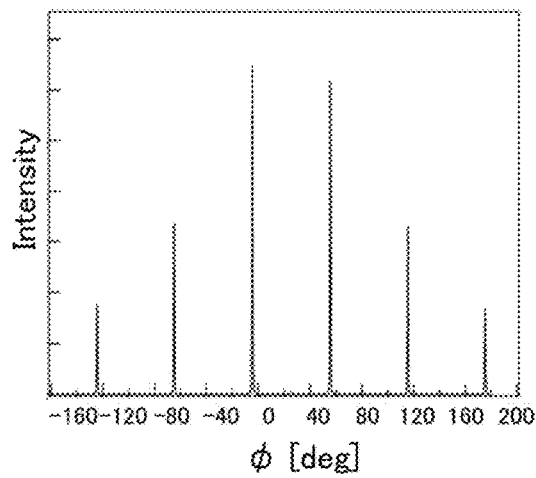

On the other hand, in structural analysis of the CAAC-OS by an in-plane method in which an X-ray is incident on a sample in a direction substantially perpendicular to the c-axis, a peak appears when $2\theta$ is around 56°. This peak is derived from the (110) plane of the $InGaZnO_4$ crystal. In the case of the CAAC-OS, when analysis ($\varphi$scan) is performed with $2\theta$ fixed at around 56° and with the sample rotated using a normal vector of the sample surface as an axis ($\varphi$axis), as shown in FIG. 26B, a peak is not clearly observed. In contrast, in the case of a single crystal oxide semiconductor of $InGaZnO_4$, when $\varphi$scan is performed with $2\theta$ fixed at around 56°, as shown in FIG. 26C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 27A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 27B shows a diffraction pattern obtained in such a manner that an electron beam with a probe diameter of 300 nm is incident on the same sample in a direction perpendicular to the sample surface. As shown in FIG. 27B, a ring-like diffraction pattern is observed. Thus, the electron diffraction also indicates that the a-axes and b-axes of the pellets included in the CAAC-OS do not have regular alignment. The first ring in FIG. 27B is considered to be derived from the (010) plane, the (100) plane, and the like of the $InGaZnO_4$ crystal. The second ring in FIG. 27B is considered to be derived from the (110) plane and the like.

Moreover, the CAAC-OS is an oxide semiconductor having a low density of defect states. Defects in the oxide semiconductor are, for example, a defect due to impurity and oxygen vacancy. Therefore, the CAAC-OS can be regarded as an oxide semiconductor with a low impurity concentration, or an oxide semiconductor having a small amount of oxygen vacancy.

The impurity contained in the oxide semiconductor might serve as a carrier trap or serve as a carrier generation source. Furthermore, oxygen vacancy in the oxide semiconductor serves as a carrier trap or serves as a carrier generation source when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS and an nc-OS are likely to be highly purified intrinsic or substantially highly purified intrinsic oxide semiconductors. Thus, a transistor including a CAAC-OS rarely has negative threshold voltage (is rarely normally on). The highly purified intrinsic or substantially highly purified intrinsic oxide semiconductor has few carrier traps. Therefore, a transistor including a CAAC-OS or an nc-OS has small variation in electrical characteristics and high reliability. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

Thus, the nc-OS is an oxide semiconductor that has high regularity as compared to an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is such an oxide semiconductor having disordered atomic arrangement and no crystal part. For example, the amorphous oxide semiconductor does not have a specific state as in quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor Layer>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (Sample A), an nc-OS (Sample B), and a CAAC-OS (Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 28:
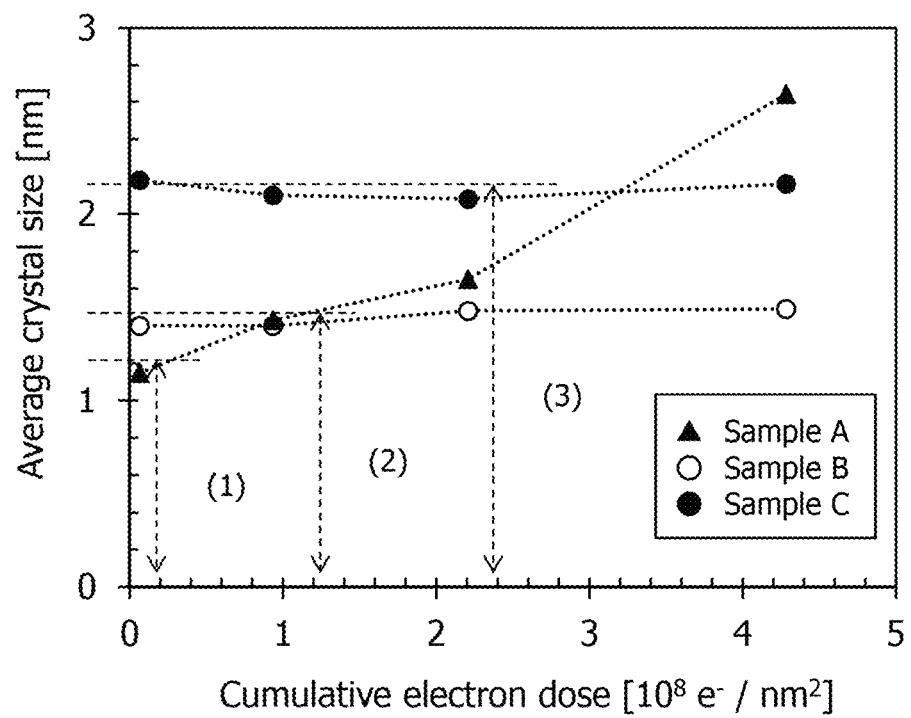
FIG. 28 shows a change in crystal part of an In—Ga—Zn oxide induced by electron irradiation.

FIG. 28 shows the change in the average size of crystal parts (at 22 points to 45 points) in each sample. Note that the crystal part size corresponds to the length of a lattice fringe. FIG. 28 indicates that the crystal part size in the a-like OS increases with an increase in the cumulative electron dose. Specifically, as shown by (1) in FIG. 28, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 28, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, a microcrystalline oxide semiconductor, and a CAAC-OS, for example.

Example

In this example, a cross-sectional shape of an oxide semiconductor and conductive films functioning as a source electrode and a drain electrode of a transistor of one embodiment of the present invention was observed. Note that cross-sectional shapes of two samples, Sample 1 and Sample 2, were observed (see FIGS. 18A, 18B, 19A, and 19B). Details of samples formed in this example are described below.

<Sample 1>

First, a substrate 1602 was prepared. A glass substrate was used as the substrate 1602. After that, an oxide semiconductor 1608 was deposited over the substrate 1602. The oxide semiconductor 1608 was formed under the condition where a metal oxide sputtering target having an atomic ratio of In:Ga:Zn=1:1:1 was used; oxygen and argon were each supplied at a flow rate of 100 sccm as a sputtering gas to a treatment chamber of a sputtering apparatus; the pressure in the treatment chamber was controlled to 0.6 Pa; and an alternate-current (AC) power of 2.5 kW was supplied. The substrate temperature during the formation of the oxide semiconductor 1608 was 170° C. The thickness of the oxide semiconductor 1608 was 35 nm.

Next, a conductive film was formed over the oxide semiconductor 1608. A Cu—Mn alloy film was formed as the conductive film by a sputtering method.

The Cu—Mn alloy film was formed to a thickness of 200 nm under the condition where the substrate temperature was room temperature; an Ar gas was supplied at a flow rate of 100 sccm to the treatment chamber; the pressure in the treatment chamber was controlled to 0.4 Pa, and a power of 2000 W was supplied to a target using a direct-current (DC) power source. Note that the distance between the substrate and the target was 340 mm. The composition of the target was Cu:Mn=90:10 [at. %].

Next, a resist mask was formed over the Cu—Mn alloy film. Then, an etchant was applied over the resist mask and wet etching treatment was performed, whereby a conductive film 1612 was formed. As the etchant, an etchant containing an organic acid solution and a hydrogen peroxide solution was used.

After that, the resist mask was removed; thus, Sample 1 of this example was formed.

<Sample 2>

First, the substrate 1602 was prepared. A glass substrate was used as the substrate 1602. After that, the oxide semiconductor 1608 was deposited over the substrate 1602. The oxide semiconductor 1608 was formed using a method similar to that in Sample 1 described above.

Next, an oxide semiconductor 1609 was deposited over the oxide semiconductor 1608. The oxide semiconductor 1609 was formed under the condition where a metal oxide sputtering target having an atomic ratio of In:Ga:Zn=1:3:6 was used; oxygen was supplied at a flow rate of 150 sccm as a sputtering gas to a treatment chamber of a sputtering apparatus; the pressure in the treatment chamber was controlled to 0.3 Pa; and an AC power of 4.5 kW was supplied. The substrate temperature during the formation of the oxide semiconductor 1609 was 170° C. The thickness of the oxide semiconductor 1609 was 35 nm.

Next, a conductive film was formed over the oxide semiconductor 1609. A Cu—Mn alloy film was formed as the conductive film by a sputtering method. The Cu—Mn alloy film was formed using a method similar to that in Sample 1 described above.

Subsequently, a resist mask was formed over the Cu—Mn alloy film. Then, an etchant was applied over the resist mask and wet etching treatment was performed, whereby the conductive film 1612 was formed. As the etchant, an etchant similar to that of Sample 1 was used.

Then, an etchant for wet etching was applied over the conductive film 1612 and the oxide semiconductor 1609 to remove part of a surface of the oxide semiconductor 1609. A solution obtained in such a manner that a phosphoric acid solution (the phosphoric acid concentration: 85%) was diluted with water by 100 times was used as the etchant for wet etching.

Next, stacked insulating films 1614 and 1616 were formed over the conductive film 1612 and the oxide semiconductor 1609.

A 50-nm-thick silicon oxynitride film was formed as the insulating film 1614. A 400-nm-thick silicon oxynitride film was formed as the insulating film 1616. The insulating film 1614 and the insulating film 1616 were successively formed in vacuum using a PECVD apparatus without exposure to the air. Since the insulating film 1614 and the insulating film 1616 were formed using the same kind of material, the interface between these films cannot be clearly defined in some cases.

Note that the substrate 1602, the oxide semiconductor 1608, the oxide semiconductor 1609, and the conductive film 1612 were subjected to heat treatment by in-situ in the treatment chamber before the formation of the insulating film 1614. The heat treatment was performed under the condition where a nitrogen gas was supplied to the treatment chamber at a flow rate of 10000 sccm, the pressure was 175 Pa, the substrate temperature was 350° C., and the heating time was 300 sec.

The insulating film 1614 was formed by a PECVD method under the condition where silane with a flow rate of 50 sccm and dinitrogen monoxide with a flow rate of 2000 sccm were used as a source gas; the pressure in the treatment chamber was 20 Pa; the substrate temperature was 220° C.; and a high-frequency power of 100 W was supplied to parallel-plate electrodes.

The insulating film 1616 was formed by a PECVD method under the condition where silane with a flow rate of 160 sccm and dinitrogen monoxide with a flow rate of 4000 sccm were used as the source gas, the pressure in the treatment chamber was 200 Pa, the substrate temperature was 220° C., and the high-frequency power of 1500 W was supplied to the parallel-plate electrodes. Under the above conditions, it is possible to form a silicon oxynitride film which contains oxygen in excess of the stoichiometric composition and from which part of oxygen is released by heating.

Through the above process, Sample 2 of this example was formed.

Figure 18A:
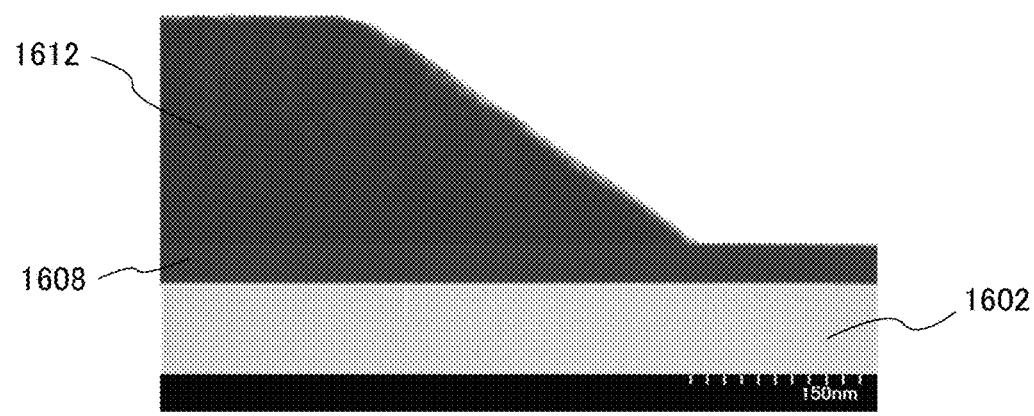
FIGS. 18A and 18B are cross-sectional TEM images in an example.
Figure 18B:
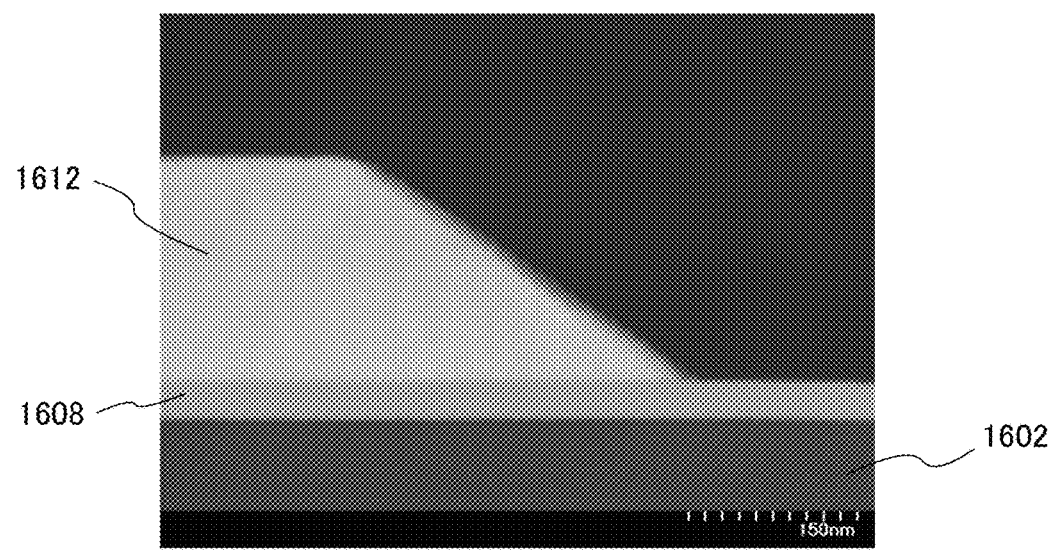
Figure 19A:
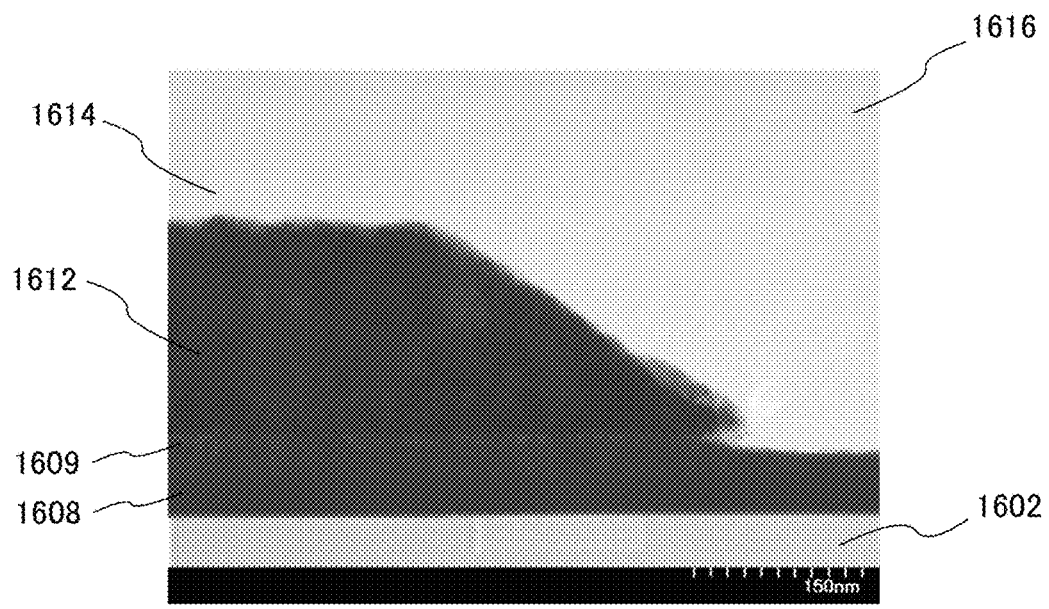
FIGS. 19A and 19B are cross-sectional TEM images in an example.
Figure 19B:
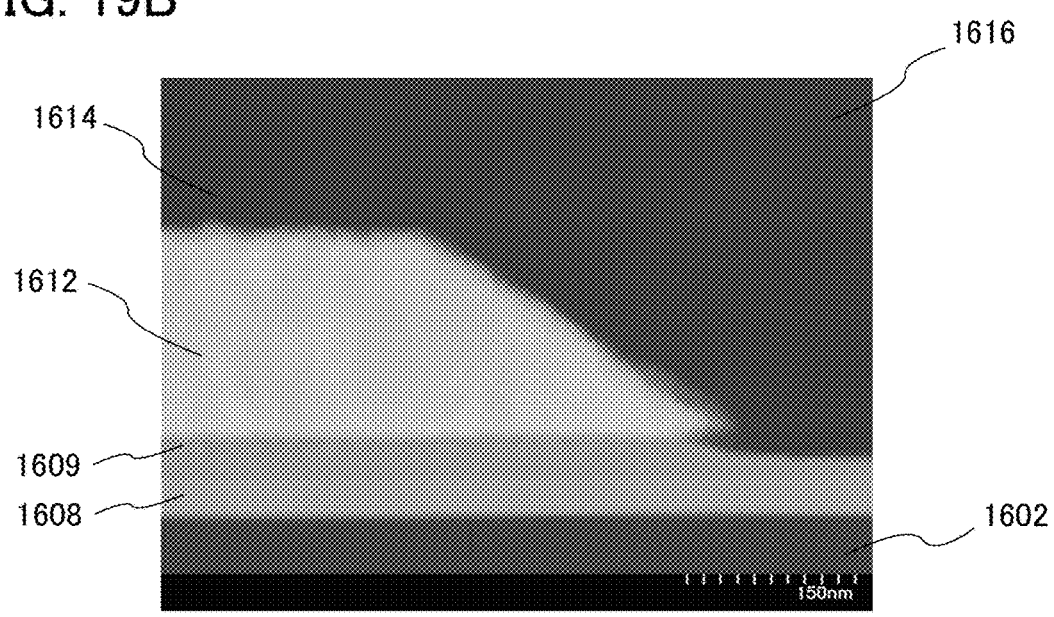

FIGS. 18A and 18B show observation results of a cross section of Sample 1, and FIGS. 19A and 19B show observation results of a cross section of Sample 2. The observations were conducted using a transmission electron microscope (TEM).

Note that FIG. 18A and FIG. 19A are phase contrast images (TE images) and FIG. 18B and FIG. 19B are Z contrast images (ZC images).

According to the TEM images in FIGS. 18A and 18B, the conductive film 1612 of Sample 1 formed in this example has a favorable cross-sectional shape over the oxide semiconductor 1608.

According to the TEM images in FIGS. 19A and 19B, the conductive film 1612 of Sample 2 formed in this example has a favorable cross-sectional shape over the oxide semiconductor 1609. Furthermore, the results in FIGS. 19A and 19B indicate that the surface of part of the oxide semiconductor 1609 was etched owing to the wet etching treatment performed over the conductive film 1612 and the oxide semiconductor 1609, whereby the thickness of the part of the oxide semiconductor 1609 is smaller than that of part of the oxide semiconductor 1609 over which the conductive film 1612 is provided.

The structure described in this example can be used as appropriate in combination with any of the structures described in the other embodiments.

This application is based on Japanese Patent Application serial no. 2013-247192 filed with Japan Patent Office on Nov. 29, 2013, the entire contents of which are hereby incorporated by reference.

What is claimed is:

1. A semiconductor device comprising:
a transistor comprising:
an oxide semiconductor layer comprising a channel formation region, the oxide semiconductor layer comprising:
a first oxide semiconductor film;
a second oxide semiconductor film on and in contact with the first oxide semiconductor film; and
a third oxide semiconductor film on and in contact with the second oxide semiconductor film;
a source electrode and a drain electrode each electrically connected to the oxide semiconductor layer;
a first oxide film on a top surface, a bottom surface, and a side surface of the source electrode;
a second oxide film on a top surface, a bottom surface, and a side surface of the drain electrode;
a gate insulating film over the oxide semiconductor layer, the source electrode, and the drain electrode; and
a first gate electrode over the oxide semiconductor layer with the gate insulating film therebetween,
wherein the oxide semiconductor layer comprises In, Zn, and O,
wherein each of the source electrode and the drain electrode comprises a first conductive film of an alloy of Cu and a metal element selected from the group consisting of Mn, Ni, Cr, Fe, Co, Mo, Ta, and Ti,
wherein each of the first oxide film and the second oxide film comprises the metal element,
wherein the gate insulating film is in contact with the oxide semiconductor layer in a region between the source electrode and the drain electrode,
wherein part of the source electrode and part of the drain electrode are each between the second oxide semiconductor film and the third oxide semiconductor film, and
wherein, in a channel width direction of the transistor, a top surface and a side surface of the second oxide semiconductor film are in contact with the third oxide semiconductor film and a bottom surface of the second oxide semiconductor film is in contact with the first oxide semiconductor film.

2. The semiconductor device according to claim 1, wherein the metal element is Mn.

3. The semiconductor device according to claim 1,
wherein each of the source electrode and the drain electrode comprises a second conductive film on and in contact with the first conductive film, and
wherein the second conductive film comprises at least one selected from the group consisting of Cu, Al, Au, and Ag.

4. The semiconductor device according to claim 3,
wherein each of the source electrode and the drain electrode comprises a third conductive film of an alloy of Cu and a metal element selected from the group consisting of Mn, Ni, Cr, Fe, Co, Mo, Ta, and Ti, and
wherein the third conductive film is on and in contact with the second conductive film.

5. The semiconductor device according to claim 1, wherein the oxide semiconductor layer is between a first portion of the first gate electrode and a second portion of the first gate electrode.

6. The semiconductor device according to claim 1,
wherein the transistor comprises:
a second gate; and
an insulating film over the second gate,
wherein the oxide semiconductor layer is over the second gate with the insulating film therebetween.

7. The semiconductor device according to claim 1, wherein the first gate electrode comprises an alloy of Cu and a metal element selected from the group consisting of Mn, Ni, Cr, Fe, Co, Mo, Ta, and Ti.

8. The semiconductor device according to claim 1, wherein the oxide semiconductor layer comprises Ga.

9. The semiconductor device according to claim 1, wherein the oxide semiconductor layer comprises a plurality of crystal parts in each of which a c-axis is aligned along a direction perpendicular to a surface of the oxide semiconductor layer.

10. The semiconductor device according to claim 1, wherein a thickness of the oxide semiconductor layer in the region between the source electrode and the drain electrode is smaller than that in a region overlapping with the source electrode or the drain electrode.

11. The semiconductor device according to claim 1,
wherein the source electrode is surrounded by the first oxide film, and
wherein the drain electrode is surrounded by the second oxide film.

12. The semiconductor device according to claim 1,
wherein a concentration of the metal element in the first oxide film is larger than a concentration of the metal element in the source electrode, and wherein a concentration of the metal element in the second oxide film is larger than a concentration of the metal element in the drain electrode.

13. The semiconductor device according to claim 1, wherein the first oxide film and the second oxide film further comprises at least one of indium and gallium.

14. The semiconductor device according to claim 1, further comprising an aluminum oxide film over the first gate electrode.

15. A semiconductor device comprising:
a transistor comprising:
    an oxide semiconductor layer comprising a channel formation region, the oxide semiconductor layer comprising:
        a first oxide semiconductor film;
        a second oxide semiconductor film on and in contact with the first oxide semiconductor film; and
        a third oxide semiconductor film on and in contact with the second oxide semiconductor film;
    a source electrode and a drain electrode each electrically connected to the oxide semiconductor layer;
    a first oxide film on a top surface, a bottom surface, and a side surface of the source electrode;
    a second oxide film on a top surface, a bottom surface, and a side surface of the drain electrode;
    a gate insulating film over the oxide semiconductor layer, the source electrode, and the drain electrode; and
    a first gate electrode over the oxide semiconductor layer with the gate insulating film therebetween,
wherein each of the first oxide semiconductor film, the second oxide semiconductor film, and the third oxide semiconductor film comprises In, Zn, and O,
wherein each of the source electrode and the drain electrode comprises a first conductive film of an alloy of Cu and a metal element selected from the group consisting of Mn, Ni, Cr, Fe, Co, Mo, Ta, and Ti,
wherein each of the first oxide film and the second oxide film comprises the metal element,
wherein the gate insulating film is in contact with the oxide semiconductor layer in a region between the source electrode and the drain electrode,
wherein part of the source electrode and part of the drain electrode are each between the second oxide semiconductor film and the third oxide semiconductor film,
wherein the third oxide semiconductor film is in contact with the second oxide semiconductor film in the region between the source electrode and the drain electrode, and
wherein, in a channel width direction of the transistor, a top surface and a side surface of the second oxide semiconductor film are in contact with the third oxide semiconductor film and a bottom surface of the second oxide semiconductor film is in contact with the first oxide semiconductor film.

16. The semiconductor device according to claim 15, wherein the metal element is Mn.

17. The semiconductor device according to claim 15, wherein each of the source electrode and the drain electrode comprises a second conductive film on and in contact with the first conductive film, and
wherein the second conductive film comprises at least one selected from the group consisting of Cu, Al, Au, and Ag.

18. The semiconductor device according to claim 17, wherein each of the source electrode and the drain electrode comprises a third conductive film of an alloy of Cu and a metal element selected from the group consisting of Mn, Ni, Cr, Fe, Co, Mo, Ta, and Ti, and
wherein the third conductive film is on and in contact with the second conductive film.

19. The semiconductor device according to claim 15, wherein the oxide semiconductor layer is between a first portion of the first gate electrode and a second portion of the first gate electrode.

20. The semiconductor device according to claim 15, wherein the transistor comprises:
    a second gate; and
    an insulating film over the second gate,
wherein the oxide semiconductor layer is over the second gate with the insulating film therebetween.

21. The semiconductor device according to claim 15, wherein the first gate electrode comprises an alloy of Cu and a metal element selected from the group consisting of Mn, Ni, Cr, Fe, Co, Mo, Ta, and Ti.

22. The semiconductor device according to claim 15, wherein each of the first oxide semiconductor film, the second oxide semiconductor film, and the third oxide semiconductor film comprises Ga.

23. The semiconductor device according to claim 15, wherein the oxide semiconductor layer comprises a plurality of crystal parts in each of which a c-axis is aligned along a direction perpendicular to a surface of the oxide semiconductor layer.

24. The semiconductor device according to claim 15, wherein a thickness of the second oxide semiconductor film in the region between the source electrode and the drain electrode is smaller than that in a region overlapping with the source electrode or the drain electrode.

25. A semiconductor device comprising:
a transistor comprising:
    an oxide semiconductor layer comprising a channel formation region, the oxide semiconductor layer comprising:
        a first oxide semiconductor film;
        a second oxide semiconductor film on and in contact with the first oxide semiconductor film; and
        a third oxide semiconductor film on and in contact with the second oxide semiconductor film;
    a source electrode and a drain electrode each electrically connected to the oxide semiconductor layer;
    a first oxide film on a top surface, a bottom surface, and a side surface of the source electrode;
    a second oxide film on a top surface, a bottom surface, and a side surface of the drain electrode;
    a gate insulating film over the oxide semiconductor layer, the source electrode, and the drain electrode; and
    a first gate electrode over the oxide semiconductor layer with the gate insulating film therebetween,
wherein each of the first oxide semiconductor film, the second oxide semiconductor film, and the third oxide semiconductor film comprises In, Zn, and O,
wherein each of the source electrode and the drain electrode comprises a first conductive film of an alloy of Cu and a metal element selected from the group consisting of Mn, Ni, Cr, Fe, Co, Mo, Ta, and Ti,
wherein each of the first oxide film and the second oxide film comprises the metal element,
wherein the gate insulating film is in contact with the oxide semiconductor layer in a region between the source electrode and the drain electrode, wherein part of the source electrode and part of the drain electrode are each between the second oxide semiconductor film and the third oxide semiconductor film, and wherein, in a channel width direction of the transistor, a top surface and a side surface of the second oxide semiconductor film are in contact with the third oxide semiconductor film and a bottom surface of the second oxide semiconductor film is in contact with the first oxide semiconductor film.

26. The semiconductor device according to claim 25, wherein the metal element is Mn.

27. The semiconductor device according to claim 25,
wherein each of the source electrode and the drain electrode comprises a second conductive film on and in contact with the first conductive film, and
wherein the second conductive film comprises at least one selected from the group consisting of Cu, Al, Au, and Ag.

28. The semiconductor device according to claim 27,
wherein each of the source electrode and the drain electrode comprises a third conductive film of an alloy of Cu and a metal element selected from the group consisting of Mn, Ni, Cr, Fe, Co, Mo, Ta, and Ti, and
wherein the third conductive film is on and in contact with the second conductive film.

29. The semiconductor device according to claim 25, wherein the oxide semiconductor layer is between a first portion of the first gate electrode and a second portion of the first gate electrode.

30. The semiconductor device according to claim 25,
wherein the transistor comprises:
a second gate; and
an insulating film over the second gate,
wherein the oxide semiconductor layer is over the second gate with the insulating film therebetween.

31. The semiconductor device according to claim 25,
wherein the first gate electrode comprises an alloy of Cu and a metal element selected from the group consisting of Mn, Ni, Cr, Fe, Co, Mo, Ta, and Ti.

32. The semiconductor device according to claim 25, wherein each of the first oxide semiconductor film, the second oxide semiconductor film, and the third oxide semiconductor film comprises Ga.

33. The semiconductor device according to claim 25, wherein the oxide semiconductor layer comprises a plurality of crystal parts in each of which a c-axis is aligned along a direction perpendicular to a surface of the oxide semiconductor layer.

* * * * *